US 6,620,642 B2

(12) United States Patent
Dudoff et al.

(10) Patent No.: US 6,620,642 B2
(45) Date of Patent: Sep. 16, 2003

(54) OPTO-ELECTRONIC DEVICE INTEGRATION

(75) Inventors: Greg Dudoff, Amherst, NH (US); John Trezza, Nashua, NH (US)

(73) Assignee: Xanoptix, Inc., Merrimack, NH (US)

( * ) Notice: Subject to any disclaimer, the term of this patent is extended or adjusted under 35 U.S.C. 154(b) by 0 days.

(21) Appl. No.: 09/896,189

(22) Filed: Jun. 29, 2001

(65) Prior Publication Data

US 2003/0006416 A1 Jan. 9, 2003

(51) Int. Cl.[7] ............................................. H01L 21/00
(52) U.S. Cl. ........................................ 438/26; 438/28
(58) Field of Search ............................... 438/27, 28, 65, 438/66, 108, 26

(56) References Cited

U.S. PATENT DOCUMENTS

| | | | |
|---|---|---|---|
| 4,533,833 A | 8/1985 | Copeland et al. | |
| 5,100,480 A | 3/1992 | Hayafuji | |
| 5,266,794 A | 11/1993 | Olbright et al. | |
| 5,269,453 A | 12/1993 | Melton et al. | |
| 5,385,632 A | 1/1995 | Goossen | |
| 5,477,933 A | 12/1995 | Nguyen | |
| 5,729,038 A | 3/1998 | Young et al. | |
| 5,793,789 A | 8/1998 | Ben-Michael et al. | |
| 5,814,889 A | 9/1998 | Gaul | |
| 5,912,997 A | 6/1999 | Bischel et al. | |
| 5,946,130 A | 8/1999 | Rice | |
| 5,991,479 A | 11/1999 | Kleinerman | |
| 6,005,262 A | 12/1999 | Cunningham | |
| 6,048,751 A | 4/2000 | D'Asaro et al. | |
| 6,118,908 A | 9/2000 | Bischel et al. | |
| 6,136,623 A | 10/2000 | Hofstetter et al. | |
| 6,172,417 B1 | 1/2001 | Goossen | |
| 6,184,066 B1 * | 2/2001 | Chino et al. | 438/106 |
| 6,215,114 B1 | 4/2001 | Yagi et al. | |
| 6,253,986 B1 | 7/2001 | Brofman | |
| 6,283,359 B1 | 9/2001 | Brofman | |
| 6,340,113 B1 | 1/2002 | Avery et al. | |
| 6,343,171 B1 * | 1/2002 | Yoshimura et al. | 385/14 |
| 2001/0020739 A1 * | 9/2001 | Honda | 257/684 |
| 2001/0038103 A1 * | 11/2001 | Nitta et al. | 257/103 |
| 2002/0081773 A1 * | 6/2002 | Inoue et al. | 438/108 |

OTHER PUBLICATIONS

International Search Report dated Oct. 18, 2002.
International Search Report dated Nov. 5, 2002.
International Search Report dated Nov. 7, 2002.
International Search Report dated Nov. 7, 2002.

(List continued on next page.)

*Primary Examiner*—Carl Whitehead, Jr.
*Assistant Examiner*—W C Vesperman
(74) *Attorney, Agent, or Firm*—Morgan & Finnegan, LLP

(57) ABSTRACT

A method of integrating a chip with a backside active optical chip is described. The backside active optical chip has at least one optical device, having an active side, including an optically active region and an optically inactive region each abutting a substrate, a bonding side opposite the active side, and a device thickness. The method involves if the substrate has a substrate thickness in excess of 100 microns over the optically active region, thinning the substrate over the optically active region while leaving at least some substrate over the optically inactive region; bonding the optical chip to the electronic chip using a flip chip process; and creating access ways in the substrate over optically active regions. A hybrid electro-optical chip having an electronic chip and a backside active optical chip is also described, wherein the hybrid electro-optical chip is created by one of the described processes. A module is also described. The module has an optical chip having at least one laser, the at least one laser having opposed mirrors defining a cavity therebetween of a thickness, an electronic chip bonded to the optical chip, a substrate over an active region of the laser, the substrate having a thickness of between about ten times the thickness and about 100 microns, and an anti-reflective coating on top of the substrate.

21 Claims, 24 Drawing Sheets

OTHER PUBLICATIONS

International Search Report dated Nov. 12, 2002.
International Search Report dated Dec. 12, 2002.
International Search Report dated Dec. 17, 2002.
International Search Report dated Nov. 27, 2002.
Ahadian, J.F., et al., "Practical OEIC's Based on the Monolithic Integration of GaAs–InGap LED's with Commercial GaAs VLSI Electronics", IEEE Journal of Quantum Electronics, vol. 34, No. 7, pp. 1117–1123, Jul. 1998.
Alduino, A.C. et al., "Quasi–Planar Monolithic Integration of High–Speed VCSEL and Resonant Enhanced Photodetector Arrays", IEEE Photonics Technology Letters, vol. 11, No. 5, pp. 512–514, May 1999.
Anderson, B., "Rapid Processing And Properties Evaluation Of Flip–Chip Underfills", Dexter Electronic Materials, 9 pages.
Corbett, B. et al., "Resonant Cavity Light Emitting Diode and Detector Using Epitaxial Liftoff", IEEE, vol. 5, No. 9, pp. 1041–1043, Sep. 1993.
Geib, K.M. et al., "Monolithically Integrated VCSELs and Photodetectors for Microsystem Applications", IEEE, pp. 27–28, 1998.
Goodman, J. et al., "Optical Interconnections for VLSI Systems", Proceedings of the IEEE, vol. 72, No. 7, pp. 850–865, Jul. 1984.
Goossen, K. W. et al., "GaAs 850 nm Modulators Solder–Bonded to Silicon", IEEE Photonics Technology Letters, vol. 5, No. 7, Jul. 1993.
Goossen, K.W. et al., "GaAs MQW Modulators Integrated with Silicon CMOS", IEEE Photonics Technology Letters, vol. 7, No. 4, pp. 360–362, Apr. 1995.

Hibbs–Brenner, M.K., et al., "VCSEL/MSM Detector Smart Pixel Arrays", IEEE, pp. 3 and 4, 1998.
Lesser, M.P. et al., "Bump Bonded Back Illuminated CCDs", SPIE, vol. 1656, pp. 508–516, 1992.
McLaren T. et al., "Assembly of VCSEL Based Smart Pixel Arrays", IEEE/LEOS Summer Topical Meeting: Smart Pixels, pp. 49 and 50, Aug. 1996.
Nakahara, T., et al., "Hybrid Integration of Smart Pixels by Using Polyimide Bonding: Demonstration of a GaAs p–i–n Photodiode/CMOS Receiver", IEEE Journal Of Selected Topics In Quantum Electronics, pp. 209–216, 1999.
Ohsaki, T., "Electronic Packaging in the 1990's—A Perspective From Asia", IEEE Transactions On Components, Hybrids, And Manufacturing Technology, vol. 14, No. 2, pp. 254–261, Jun. 1991.
Pommerrenig, D.H. et al., "Hybrid silicon focal plane development: an update", SPIE, vol. 267, pp. 23–30, 1981.
Pu, R. et al., "Comparison of Techniques for Bonding BCSELs Directly to ICs", SPIE vol. 3490, pp. 498–501, Jun. 2005.
Pu, R. et al., "Hybrid Integration of VCSELs to Foundry Fabricated Smart Pixels", IEEE/LEOS Spring Meetings, pp. 25 and 26, 1997.
Sasaki, J. et al., "Self–aligned Assembly Technology for Optical Devices Using AuSn Solder Bumps Flip–Chip Bonding", pp. 260–261.

* cited by examiner

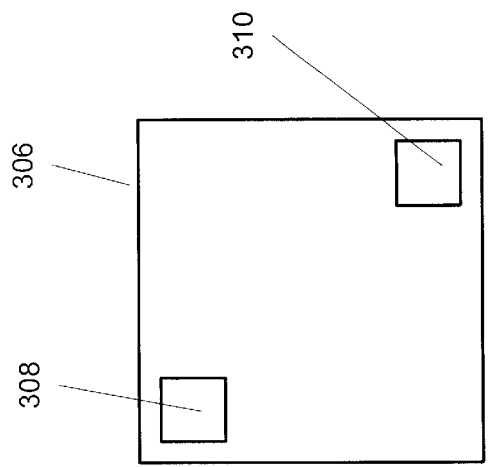
FIG. 3
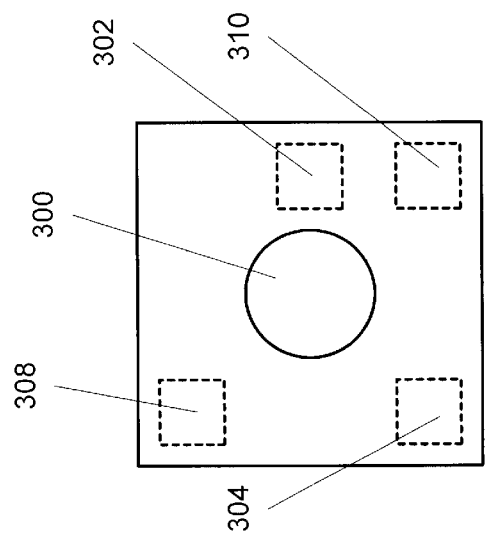
FIG. 4
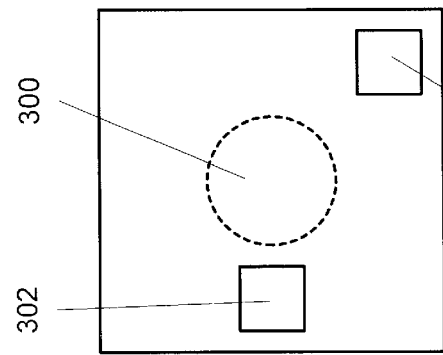

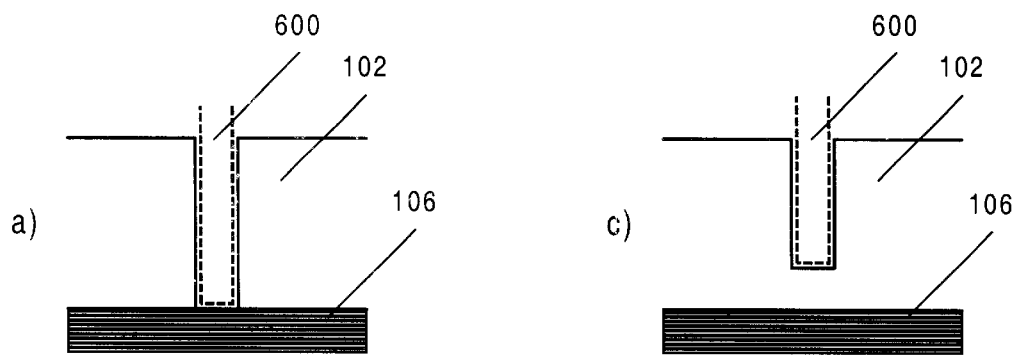
FIG. 6
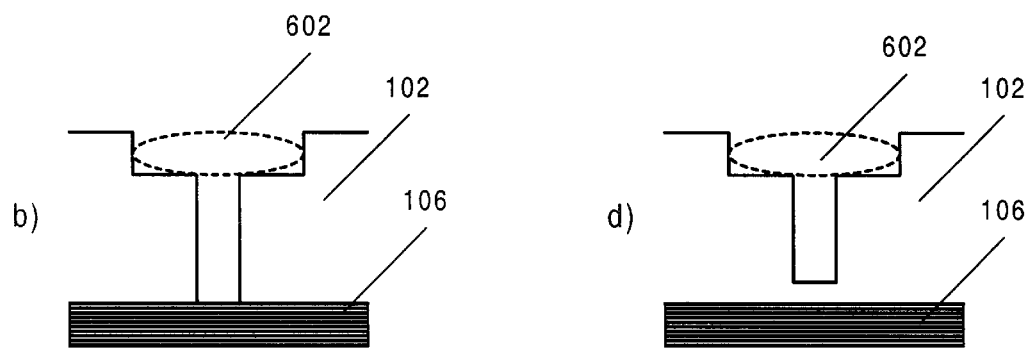

OPTO-ELECTRONIC DEVICE INTEGRATION

FIELD OF THE INVENTION

This invention relates to opto-electric chip integration and, more particularly, to high yield dense integration of opto-electronic devices.

BACKGROUND

FIGS. 1 and 2 illustrate approaches that have been used in the prior art to attach multiple bottom emitting (or detecting) (also referred to as "backside emitting (or detecting)") devices to form an integrated electro-optical chip.

According to the approach of FIG. 1, multiple lasers, are formed on a wafer substrate 102 in a conventional manner, as are multiple detectors (interchangeably referred to herein as photodetectors) on their own or on a wafer substrate in common with the lasers. Typically, the portion 104 of the substrate 102 closest to the junction between the optical devices 106, 108 and the substrate 102 is made of a material which is optically transparent at the wavelength at which the optical devices operate. The devices 106, 108 are then processed using conventional techniques such as wet or dry etching to form trenches 112 among the devices 106, 108 which separate them into a series of discrete individual lasers 106 or detector 108 devices. Depending upon the particular technique used, the etched trenches 112 may stop prior to reaching the substrates 102 or extend partly into the substrates 102. Following etching, the substrates 102 and their associated devices are inverted, aligned to the proper location over a Silicon (Si) electronic wafer 114, and bonded to the Si electronic wafer 114 using conventional flip-chip bonding techniques. Following bonding, the entirety of the substrates 102 are thinned extremely thin, by conventional mechanical polishing methods, conventional etch techniques or some combination thereof, to on the order of about 5 microns or less to allow for close optical access to the devices and create an integrated electro-optical wafer 116.

Optionally, the integrated electro-optical wafer 116 is then patterned, using conventional techniques, to protect the individual lasers and the individual detectors are coated with an anti-reflection (AR) coating 118.

A related alternative approach to the technique of FIG. 1 is shown in FIG. 2. In this approach, lasers and detectors are formed as described above. However, when the technique of FIG. 2 used, the trenches 112 are etched into the substrates 102. The substrates 102 and their associated devices are then inverted, aligned to the proper location over a Silicon (Si) electronic wafer 114, and bonded to the Si electronic wafer 114 using conventional flip-chip bonding techniques. Following bonding, the substrates 102 are then wholly removed, by conventional mechanical polishing methods, conventional etch techniques or some combination thereof, to allow for close optical access to the devices and create an integrated electro-optical wafer 116.

Optionally, the integrated electro-optical wafer 116 is then patterned to protect the individual lasers and the individual detectors are coated with an anti-reflection (AR) coating.

The techniques of both FIG. 1 and FIG. 2 make it possible to get optical fibers or optical lenses close enough to the devices to capture the appropriate light without allowing light coming from, or going to, adjacent devices to affect any of those adjacent devices, a problem known as "crosstalk". Typically, this requires that the separation distance between a device and an optical fiber or optical microlens be less than 100 microns.

Additionally, both techniques ensure that there are no significant absorbing layers over the active region of the devices that will prevent light from escaping since the thinning technique of FIG. 1 reduces the thickness of the entire substrate 102 to about 5 microns or less and the approach of FIG. 2 removes the substrate 102 entirely, leaving multiple wholly independent optical devices.

Both of these techniques however, characteristically create opto-electronic chips that have heat dissipation problems during use and leave the individual devices more sensitive to thermal and mechanical stresses produced during the manufacturing process, thereby reducing individual device lifetimes and, accordingly, decreasing yields and overall chip life.

Moreover, for the approach of both FIG. 1 (where the substrate is extremely thin) and FIG. 2 (where the substrate is completely removed), stresses experienced by the devices are primarily transferred to the very thin optical device layer which is the structurally weakest part of the device.

Thus, there is a need for a way to create an integrated opto-electronic chip that is not as sensitive to the thermal and or structural stresses resulting from processing and/or use.

In addition, a manufacturer of opto-electronic devices has two avenues for obtaining the optical and electronic wafer—they can manufacture either or both themselves, or they can obtain one or both from a third party. By manufacturing both the optical devices (interchangeably referred to for simplicity as an "optical chip") and the electronic wafer (interchangeably referred to for simplicity as an "electronic chip"), the manufacturer can take measures to ensure that the pads on each are properly placed so as to align with each other when the optical chip is positioned over the electronic chip. However, typically electrical and optical chips are not designed concurrently, even if they are designed and fabricated within the same organization. Thus, even with a single manufacturer, unless there is close coordination within the organization with regard to both the optical and electronic chip design, a lack of correspondence between contact pads on each can easily occur—particularly where one or both are also designed with sales to third parties in mind or integration with devices from other sources is contemplated. Moreover, subsequent improvements or changes in the design of either may necessitate altering the location of the contact pads, thereby introducing a pad misalignment where none previously existed.

Even worse, if the electronic chip is designed to be used with a variety of different optical chips, but the optical chips are commodity stock obtained from third parties (for example, chips containing: topside emitting vertical cavity lasers, bottom emitting vertical cavity lasers, distributed feedback (DFB) or distributed Bragg reflector (DBR) lasers (which each have better chirp and linewidth characteristics for long distance applications), topside receiving detectors or bottom receiving detectors) that are mass manufactured for distribution to multiple unrelated users, it is unlikely that the pads on the optical devices will all be located in the same place, even if they are otherwise compatible with the electronic chip.

For example, as shown in FIG. 3, a single optical device 300 has contact pads 302, 304 placed in the position specified by its manufacturer. A portion of an electronic wafer 306 also has contact pads 308, 310, onto which an optical device can be connected, placed in the position specified by its manufacturer. If the optical device is flipped over, for flip-chip type bonding with the electronic wafer, the contact pads 302, 304, 308, 310, of each will not be aligned as shown in FIG. 4.

This presents a problem in that it limits the ability to "mix-and match" devices. Moreover, if a chip is designed with connection to a particular other chip in mind, and subsequent events create a need to use a different device with a different contact placement, all the planning and coordination done for the original device will be irrelevant to the new device.

Thus, there is a further need for a process that facilitates the ability to mix and match devices without there being any coordination between the designers of either or the use of a standard or common contact placement scheme.

In addition, in some cases it is sometimes desirable to coat some of the devices, specifically the detectors, with an AR coating.

An AR coating prevents light from hitting the top of a detector device and being reflected at the detector-air interface due to the differences in the indexes of refraction. This is important for detectors because reflected light is light that does not enter the detector itself and hence can not be converted into electrical signals (i.e. it is 'lost light' from a system point of view). Thus an AR coating optimizes the collection efficiency of the detector because it prevents light from being reflected at that interface.

Lasers however, require a top mirror of very high in reflectivity in order to operate. AR coating on a laser changes the reflectivity of the top mirror. As a result, at a minimum it will detrimentally affect the lasing action of the laser, if not prevent it from lasing altogether.

If a wafer has both lasers and detectors in an array, in order to AR coat only the detectors, conventional wisdom would mandate that special patterning of the wafer be performed to protect the lasers during the AR coating deposition phase to ensure that those laser devices were not covered by the AR coating.

The protection or disparate treatment of the various different devices on the wafer requires extra processing steps, which costs time, and hence increases the cost of processing. It also introduces the possibility of damaging the protected devices. Finally, it forces the electrical contact pads to be protected as well.

In addition disparate treatment of devices causes other processing problems when the processing must be performed on a chip having electrical contact pads in the same area. For example, if a chip has electrical contacts near the devices and electroplating, electroless plating, thermal evaporates, e-beam evaporated or sputtering techniques are used to place solder on the contact pads, the height of the resulting solder bumps, renders it difficult to pattern areas to protect lasers from AR coating because the solder bumps are much taller than the optical devices.

Prior art lacks a way to eliminate the need to pattern a protective layer over the lasers while allowing the entire wafer (i.e. lasers and detectors) to be AR coated.

Thus, there is a further need for a way to permit integration of multiple types of devices on an electronic chip so that any additional processing steps, such as anti-reflection coating, can be done on the whole wafer at one time and without special patterning after integration.

SUMMARY OF THE INVENTION

We have devised a way of creating electro-optical chips that, in various implementation variants, overcome one or more of the above shortcomings of the prior art, resulting in higher yields and longer life (i.e. more reliable) devices. In particular, we have devised a way to create opto-electronic chips which, in some variants, provides one or more of the following advantages: allows use of a lower operating current, thereby reducing power consumption and heat generation; provides better dissipation of heat that is generated, allowing the lasers to run at lower temperatures thereby increasing their usable life and/or providing better wavelength control; and/or having a higher structural integrity resulting in fewer defects and increased device lifetime.

We have further devised a way to integrate optical and electronic chips to create an integrated opto-electronic device, irrespective of whether the component devices are manufactured in a coordinated manner or have compatibly matching electrical contact points.

Still further, we have devised a way to create an integrated opto-electronic device that allows for an entire wafer having disparate devices to be AR coated, without special processing to protect the lasers or affecting their ability to lase.

When integrating optical devices intimately with electronic chips, four attributes are desirable to create reliable integrated optical devices.

First, it must be possible to get optical fibers or optical lenses close enough to capture the light without crosstalk. Second, there must be no absorbing layers above the active region of the devices that would prevent light from escaping or entering the particular devices. Third, there should be a large enough thermal mass attached to the devices to allow for efficient heat dissipation. Fourth, the structural integrity of the devices should be maintained during processing so that stresses or strains experienced by the devices do not impact device performance.

As noted above, the approaches of FIG. 1 and FIG. 2 can satisfy the first two attributes however, neither of those approaches satisfies the third or fourth since neither approach results in a large thermal mass attached to the devices (i.e. the substrate of the devices) or reduces stresses on the devices.

Although applicants are unaware of any such case existing in the prior art or otherwise, the approach of FIG. 1 could potentially be made to satisfy the fourth attribute by leaving a thicker layer of substrate on the device. However, this could likely only be accomplished if the operating wavelength of the particular devices were very transparent to the wavelength at which the devices operated. Moreover, for many cases, this would reduce, if not destroy, the ability to satisfy the first attribute and would likely also detrimentally impact the operation of a laser device unless the laser were redesigned to emit into, for example, a semiconductor material rather than being designed to emit into air. In addition, if thicker substrates were left, it would be necessary to AR coat the structure to prevent optical feedback into the laser. In addition, such an approach would likely also foreclose the use of commercially purchasable prefabricated semiconductor optical devices, such as most third party offered Vertical Cavity Surface Emitting Lasers (VCSELs), Distributed Feed Back (DFB) lasers or Distributed Bragg Reflector (DBR) lasers.

In sum, we have devised a way to closely integrate optical devices and an electronic chip to create an opto-electronic chip that can satisfy all four attributes. Moreover we can do so using devices acquired from third parties when desired. Still further, we offer advantages over the prior art in terms of lower cost to produce, higher yield and improved operating life.

A first aspect of the invention involves a method of integrating a chip with a backside active optical chip. The backside active optical chip has at least one optical device, having an active side, including an optically active region and an optically inactive region each abutting a substrate, a bonding side opposite the active side, and a device thickness. The method involves if the substrate has a substrate thickness in excess of 100 microns over the optically active region, thinning the substrate over the optically active region while leaving at least some substrate over the optically inactive region; bonding the optical chip to the electronic chip using a flip chip process; and creating access ways in the substrate over optically active regions.

A second aspect of the invention involves a hybrid electro-optical chip having an electronic chip and a backside active optical chip is also described, wherein the hybrid electro-optical chip is created by one of the described processes.

A third aspect of the invention involves a module that has an optical chip having at least one laser, the at least one laser having opposed mirrors defining a cavity therebetween of a thickness, an electronic chip bonded to the optical chip, a substrate over an active region of the laser, the substrate having a thickness of between about ten times the thickness and about 100 microns, and an anti-reflective coating on top of the substrate.

These and other aspects described herein, or resulting from the using teachings contained herein, provide advantages and benefits over the prior art.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

FIG. 3 illustrates a single optical device with contact pads placed in the position specified by its manufacturer and a portion of an electronic wafer with contact pads placed in the position specified by its manufacturer;

FIG. 4 illustrates a single optical device with contact pads placed in the position specified by its manufacturer and a portion of an electronic wafer with contact pads placed in the position specified by its manufacturer of which each will not be aligned;

FIGS. 6 and 7 illustrates several different access way variant examples;

DETAILED DESCRIPTION

Figure 5:
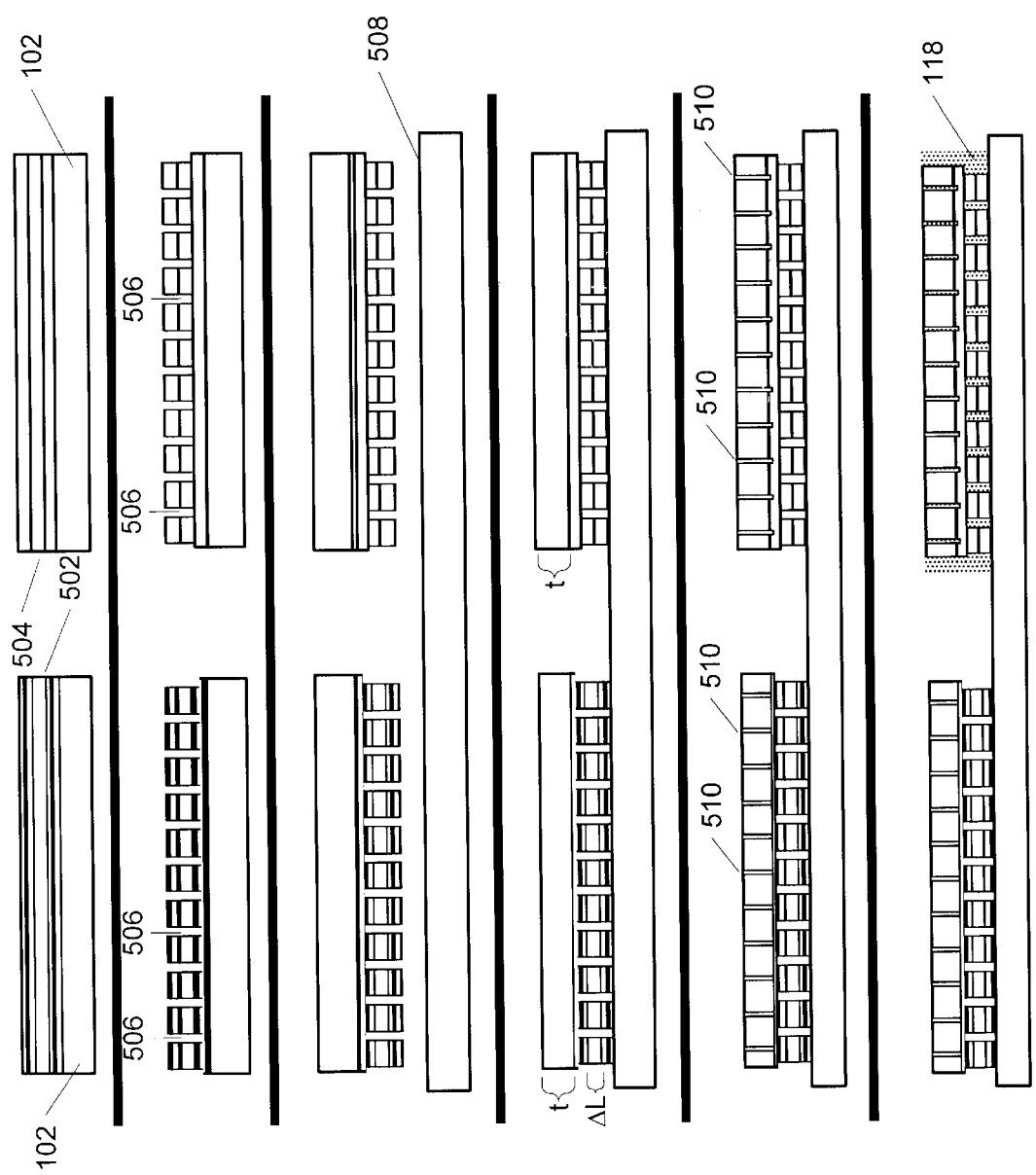
FIG. 5 illustrates in simplified high level overview, one example approach according to the teaches of the invention.

FIG. 5 shows, in simplified high level overview, one example approach according to the teachings of the invention. This approach overcomes shortcomings of the prior art while permitting close optical access, removing absorbing regions, providing a higher structural integrity, and having better thermal dissipation characteristics.

In the approach of FIG. 5, a laser wafer 502 (made up of lasers integrated with a substrate 102) and a detector wafer 504 (made up of detectors integrated with a substrate 102) is obtained, for example, by manufacturing them using a conventional technique or by purchase from an appropriate third party. Alternatively, a hybrid wafer made up of both lasers and detectors integrated with a common substrate, for example, in some alternating pattern or other grouping, is manufactured or obtained.

Trenches 506 are etched to process a wafer into individual devices (by etching into the substrate) or, in some cases, into appropriate groups of devices, for example, as shown in a commonly assigned application entitled Redundant Device Array filed concurrently herewith (and which is incorporated herein by reference) by etching into the substrate in some places while stopping the etch prior to it reaching the substrate in others.

Alternatively, since the invention is not the creation of the optical chip itself, per se (i.e, the creation of the wafer, growth of the devices, or etching to created discrete devices), the above would be skipped entirely if the optical device wafer was purchased instead of made.

The optical device wafer is then inverted and aligned over an electronic wafer 508 and bonded to the electronic wafer 508 using, for example, conventional flip-chip bonding techniques or some other appropriate proprietary technique that accomplishes bonding of the optical wafer to the electronic wafer in a suitable and reliable manner.

Figure 1:
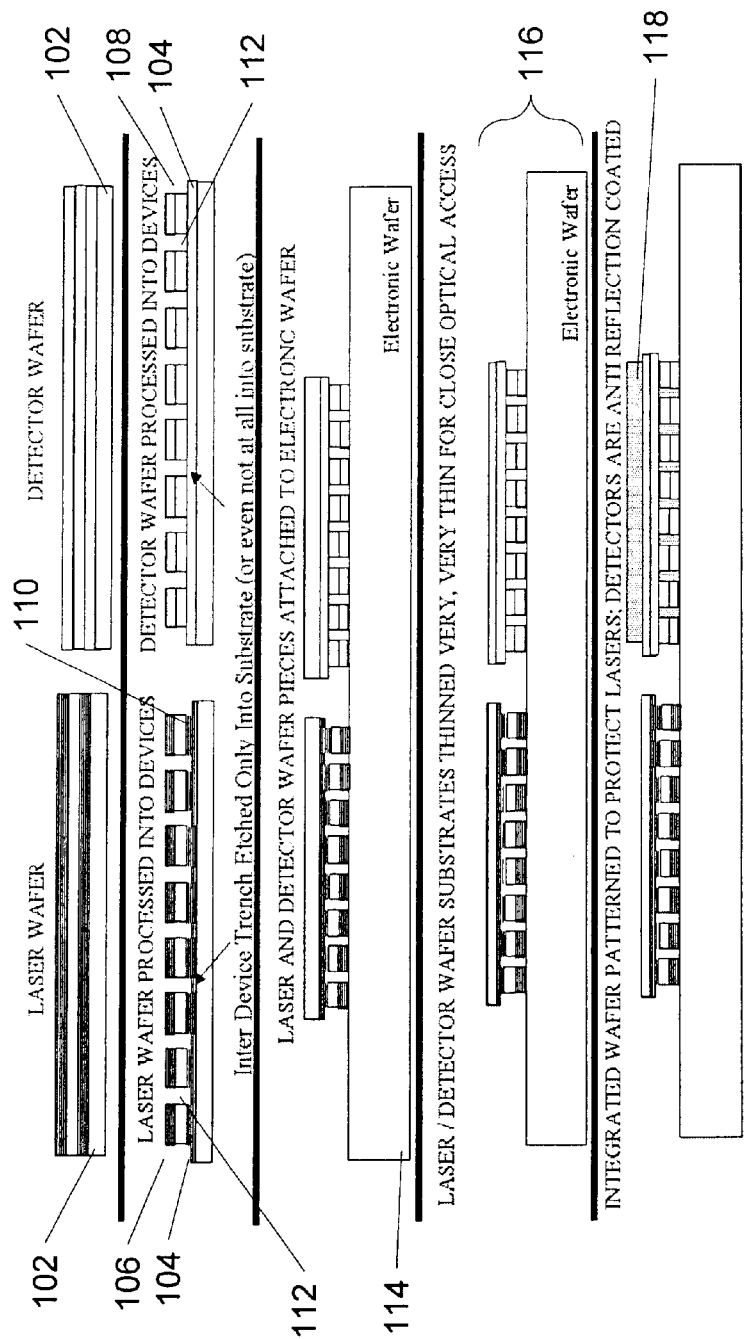
FIG. 1 illustrates approaches that have been used in the prior art to attach multiple bottom emitting devices to form an integrated electro-optical chip.
Figure 2:
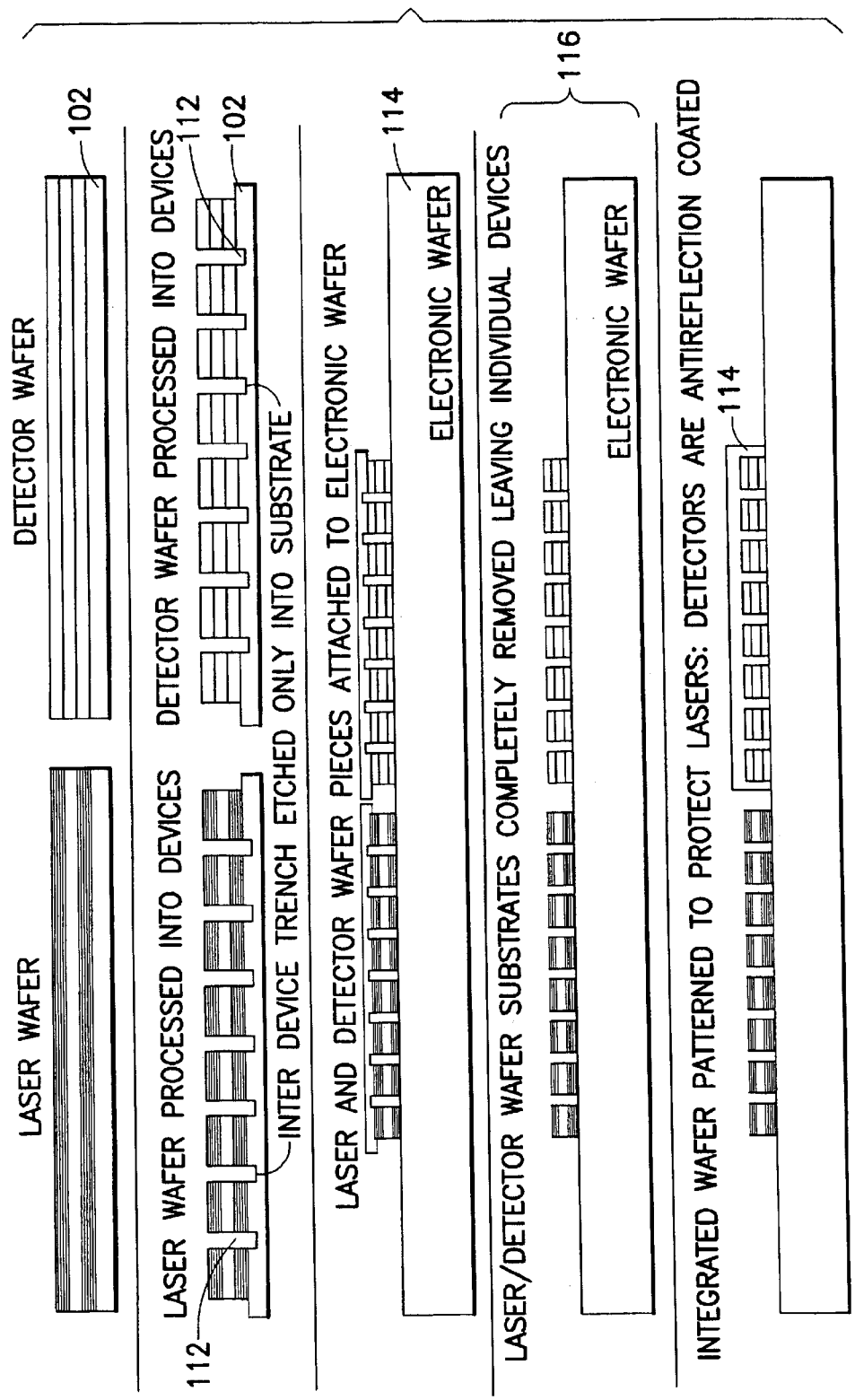
FIG. 2 illustrates approaches that have been used in the prior art to attach multiple bottom emitting devices to form an integrated electro-optical chip.

Alternatively, and advantageously in some cases, further processing of the substrate 102 can be accomplished, as described immediately below, either prior to bonding an optical wafer to the electronic wafer or after bonding, so long as it is done before cycling the devices over operational temperature extremes by device operation if done after. Such processing is unsuitable for the prior art techniques described above in connection with FIGS. 1 and 2 because, if used, it would dramatically increase the cost of producing devices by requiring individual bonding of each discrete device if the substrate were completely removed or dramatically reduce the yield, due to stress and/or strain problems when the substrate is very thin.

Depending upon the particular wafer(s) and optical devices used, different processing variants are now possible.

In a first variant, the substrate is thinned down to a thickness in excess of 50 microns, typically to within a range of between about 50 microns to about the 100 micron thickness typically required for close optical access.

In a second variant, the substrate is thinned to a thickness of between about 100 microns and about a thickness corresponding to the thickness of the optical device portion of the wafer.

In a third variant, the substrate is thinned to between about 20 microns and about 50 microns.

In a fourth variant, where the thickness of the substrate is about equal to the thickness of the optical device portion of the wafer, thinning is not required.

In a fifth variant, the substrate is thinned down to a thickness about equal to the thickness of the optical device portion of the wafer.

As will be apparent from the description below, in accordance with the invention, the thickness of the overall substrate could also be kept larger that the thickness necessary for close optical access, for example, where access ways are constructed (as described below) to allow for insertion of an optical fiber or microlens into the access way to a separation spacing from the device within the close optical access range. However, it is expected that such a case will be a typical.

An access way 510, in the form of a trench or hole is also etched or drilled in the substrate over the portion of an optical device where light is emitted or detected, for example, using conventional etching or drilling techniques, while preferably leaving some of the remaining substrate intact. Depending upon the particular substrate and device(s) different techniques can be used including laser drilling, etching or some combination thereof. In addition, depending upon the particular technique used, the access ways may have straight sidewalls, sloped sidewalls or some combination thereof.

For example, in order to produce an access way 510, having initially straight sidewalls near the substrate outer surface and sloped sidewalls near where the substrate meets the device, in a Gallium Arsinate (GaAs) substrate with an (Aluminum Gallium Arsinate) AlGaAs stop layer (supporting optical devices such as VCSELs and/or photodetectors (interchangeably referred to herein as detectors)) hybridized to an ASIC (collectively referred to as the "Sample"), the following approach can be used:

First, the access ways 510 are resist patterned on the substrate.

Then the sample is loaded into a 13.56 MHz parallel plate reactive ion etcher (RIE) and evacuated to a pressure below about $3 \times 10_{-5}$ Torr before introduction of the precess gasses to reduce or eliminate residual water. Once this base pressure is reached, the first part of the etch is initiated at the process conditions of Table 1.

TABLE 1

| | |
|---|---|
| SiCl4 | 14 sccm |
| SF6 | 7 sccm |
| Pressure | 20 mTorr |
| Chuck Temp. | 30° C. |
| RF Power | 129 watts |
| Bias | −245 Vdc |
| Time | 5 min |

This produces a straight sidewall extending from the surface of the substrate into the substrate for a distance towards the device.

The process conditions are then optimized to produce the portion of the access ways 510 having sloped sidewalls with, in this example case, GaAs to AlGaAs selectivity near infinity with minimal device damage. In particular the process conditions are shown in Table 2.

TABLE 2

| | |
|---|---|
| SiCl4 | 14 sccm |
| SF6 | 7 sccm |
| Pressure | 70 mTorr |
| Chuck Temp. | 30° C. |
| RF Power | 92 watts |
| Bias | −190 Vdc |
| Time | 30 min |

Then the process conditions are optimized to getter the residual Cl from the AlGaAs stoplayer. This is to prevent further formation of HCl (i.e. performing a wet etching) after the Sample is unloaded from the processing chamber. The process conditions for this portion of the process are set forth in Table 3.

TABLE 3

| | |
|---|---|
| SF6 | 7 sccm |
| Pressure | 70 mTorr |
| Chuck Temp. | 30° C. |
| RF Power | 50 watts |
| Bias | −20 Vdc |
| Time | 3 min |

In the simplest case, the access way will be as small as possible, so as to maximize the amount of substrate left on the device. The remaining substrate provides a rigid framework which prevents the individual devices from undergoing stresses, for example, during attachment to the electronic wafer. Depending upon the particular devices and substrate used however additional removal of substrate may further be performed, for example, at the time the access way is created, or by patterning the substrate at some point, for example, following attachment to the electronic wafer.

It should be noted however, that if removal of additional substrate is not properly planned, as more substrate is removed, the thermal dissipation advantage may be reduced or even eliminated. Moreover, depending upon how much, and/or from where, additional substrate is removed, the ability to withstand stress and strain may also be decreased. However, it can be appreciated, that, in some cases, by selective removal of substrate thermal dissipation can be improved by increasing the overall surface area of the substrate without sacrificing much, if any, of the structural advantages. Thus, it should be understood that the important aspect of the substrate removal is that sufficient substrate is left on the devices to ensure the desired thermal and structural characteristics are achieved.

Moreover, depending upon the particular technique used, provision of the access ways may advantageously be, in some cases, performed before or after bonding is performed, for example, before, after, or while the trenches separating the individual devices are etched.

Optionally, an AR coating can be applied to the detectors, if desired.

Figure 7:
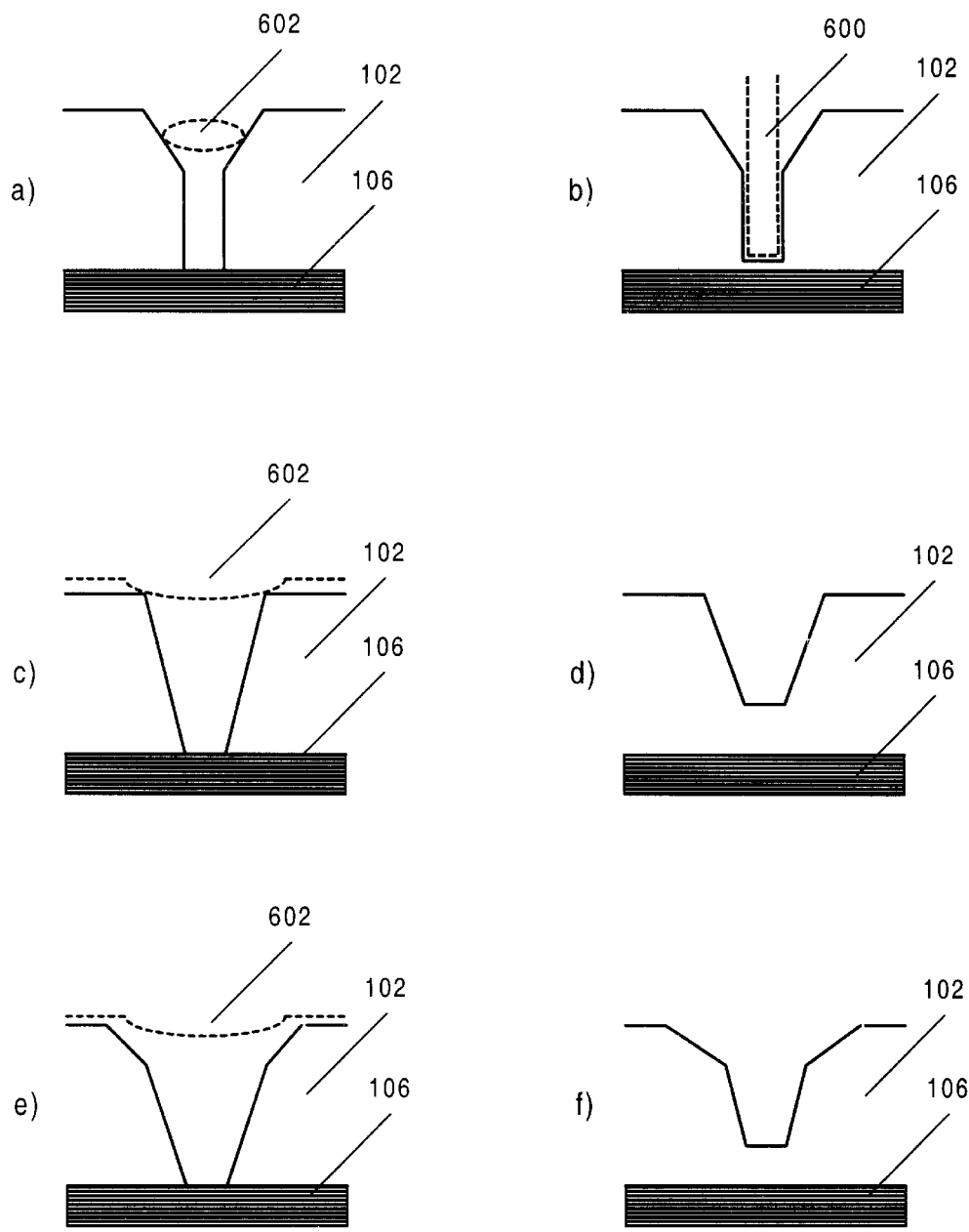

Depending upon which of the three immediately preceding variants above are used, different processing will occur. FIGS. 6 and 7 show several different accessways variant examples. For example, if the first variant was used, the access ways may extend entirely through the substrate (as shown in FIGS. 6a, 6b, 7a, 7c, 7e). Alternatively, they may extend from the outer surface of the substrate to a depth where the substrate remaining directly over the portion of an optical device where light is emitted or detected is reduced but not completely removed, for example, as shown in FIGS. 6c, 6d, 7b, 7d, 7f). In general, the substrate remaining directly over the portion of the optical device where light is emitted or detected will be reduced to a thickness of about 100 microns or less to enable close optical access to the device. In other cases, the thickness may be reduced to about 50 microns or less, and in some cases 20 microns or less, although typically the thickness will be within the range of about 20 microns to about 50 microns.

Additionally, depending upon the particular access way created, the access way may further be advantageously used to accommodate an optical fiber, for example, as shown in FIGS. 6a, 6c, 7b or a microlens, for example, as shown in FIGS. 6b, 6d, 7a, 7c.

Figure 8:
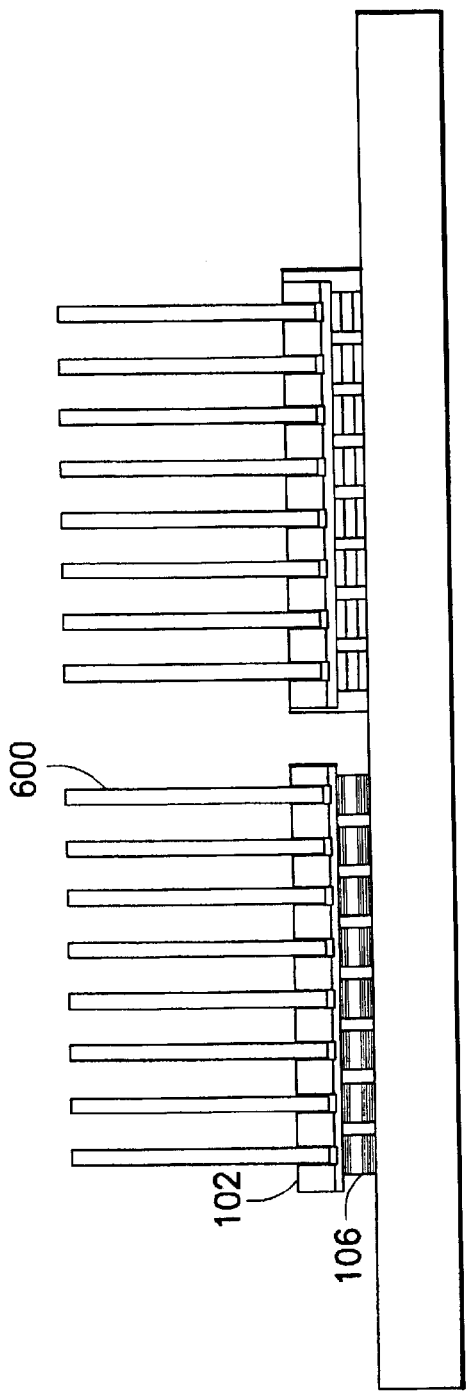
FIG. 8 illustrates an optical array in which fibers are supported by the substrate.
Figure 9:
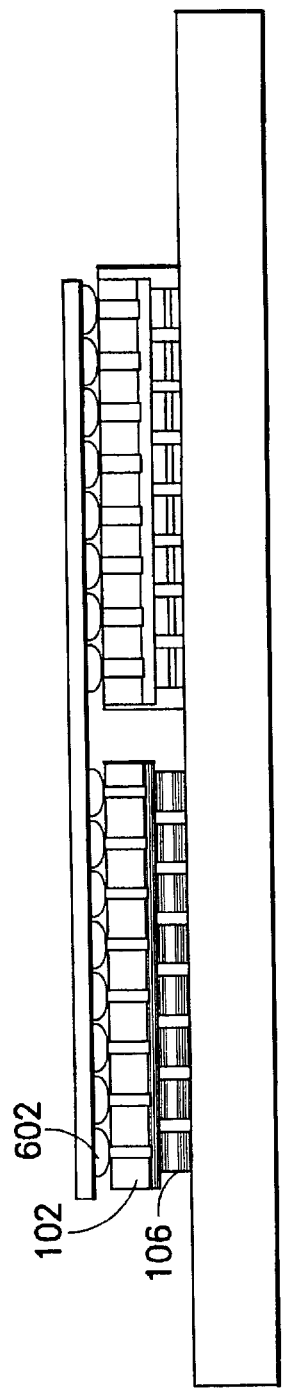
FIG. 9 illustrates an optical array that accommodates an array of microlenses.

Thus, by employing one of the above approaches, an optical array in which ends of fibers are supported by the substrate can be created (such as shown in FIG. 8), an optical array that accommodates one or more individually placed microlenses supported by the substrate can be created (such as shown in FIGS. 6b, 6d, 7a, 7c, 7e), or an optical array that accommodates an array of microlenses can be created (such as shown in FIG. 9).

As noted above, the substrate can also be patterned to roughen the surface of the substrate and increase the exposed surface area for better thermal dissipation.

It should be appreciated that, by using the techniques described herein, i.e. leaving substrate attached, stresses will primarily not propagate to optical devices, but rather will be taken up by the connecting medium or the electronic chip, both of which are better able to withstand such stresses.

FIGS. 10–13 are each example illustrations of the process of creating electro-optical chip variants according to the techniques described above.

Figure 10A:
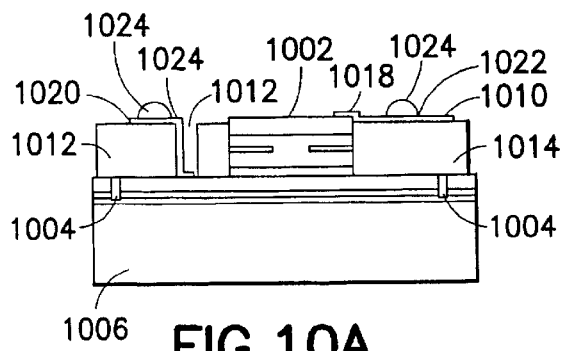
FIG. 10 illustrates one example process for creating an electro-optical chip variant according to the techniques described.

FIG. 10a is a simplified view of a single bottom surface emitting laser device 1002 that is part of an array of laser devices, the rest of which are not shown.

The device 1002 is isolated from its neighbors by isolating trenches 1004 and is supported on a substrate 1006 made of an appropriate material, for example, Silicon (Si), Silicon-Germanium (SiGe), Gallium-Arsenide (GaAs) or Indium-Phosphate (InP). Although the particular material used for the substrate will likely be determined by factors independent of the invention, it is worth noting that stresses due to thermal factors can be reduced by matching the coefficients of expansion of the optical device substrate and the electronic wafer as closely as possible. Ideally, the two should be of the same material, so that the coefficients of expansion of both are the same.

Electrical contacts 1008, 1010 used for laser excitation and control are each mounted on a stand 1012, 1014 for support. One end 1016, 1018 of each electrical contact acts as an electrode for the laser device and the other end of each is a pad 1020, 1022 onto which an electrically conductive material 1024, such as a solder, is deposited for bonding the device 1002 to an electronic wafer.

Figure 10D:
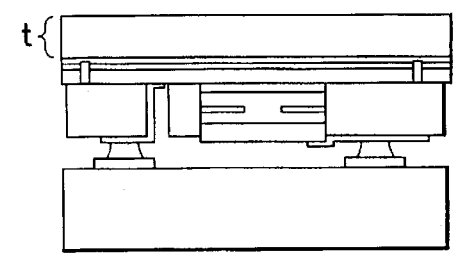
Figure 10B:
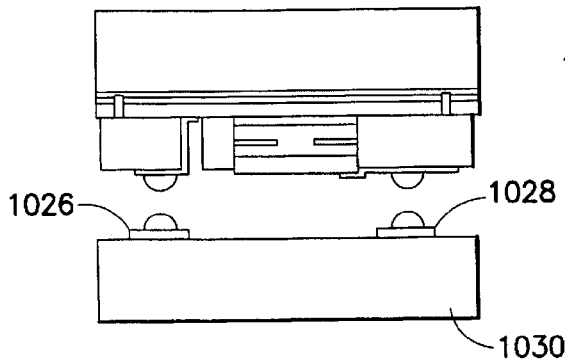

FIG. 10b shows the laser device 1002 of FIG. 10a after the laser array has been inverted and positioned over corresponding pads 1026, 1028 of an electronic wafer 1030.

Figure 10E:
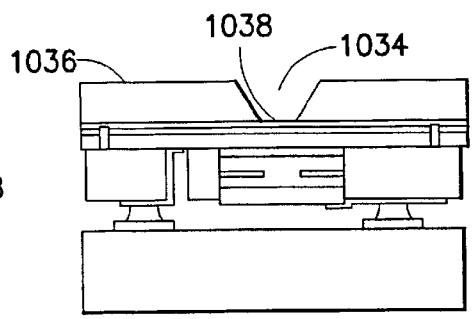
Figure 10C:
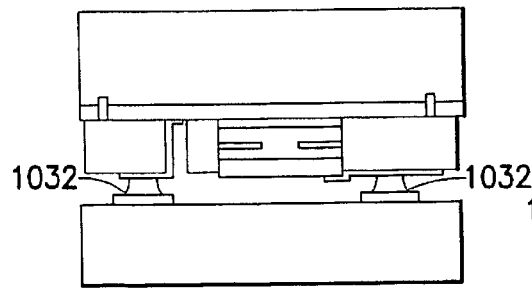

FIG. 10c shows the laser device 1002 after it has been attached to the electronic wafer 1030 via a solder bond 1032 between the respective pads 1020, 1022, 1026, 1028.

FIG. 10d shows the laser device after the substrate 1006 has been thinned to between about 20 microns and about 50 microns.

FIG. 10e shows the device after the access way 1034 has been created in the substrate 1006, in this case via etching instead of drilling. Note that in this example, the access way extends from the surface of the substrate 1036 to the device cladding layer 1038.

Figure 10F:
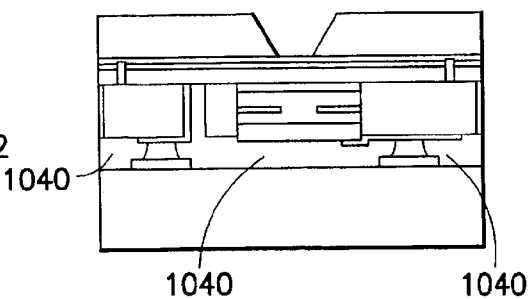
Figure 11A:
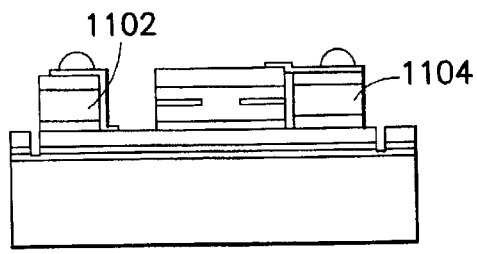
FIG. 11 illustrates one example process for creating an electro-optical chip variant according to the techniques described.
Figure 11B:
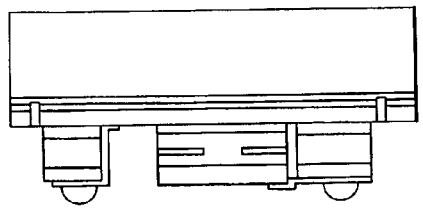
Figure 11B:
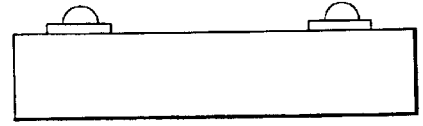
Figure 11C:
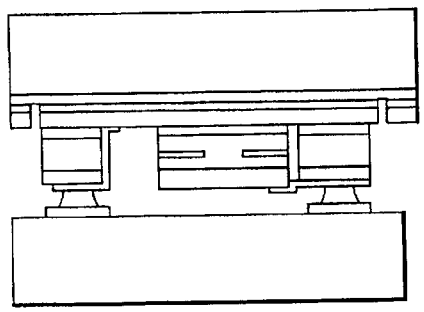
Figure 11D:
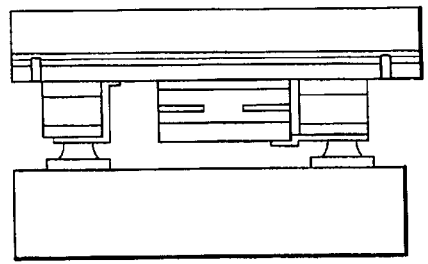
Figure 11E:
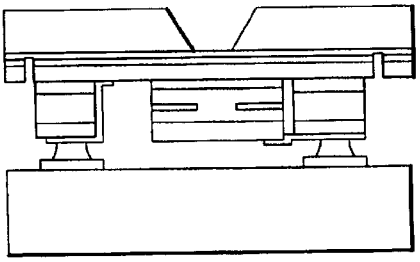
Figure 11F:
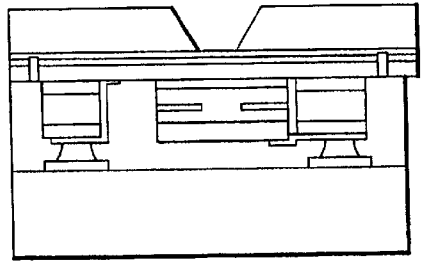
Figure 12A:
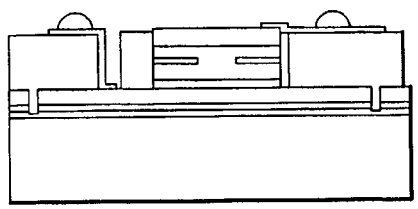
FIG. 12 illustrates one example process for creating an electro-optical chip variant according to the techniques described.
Figure 12B:
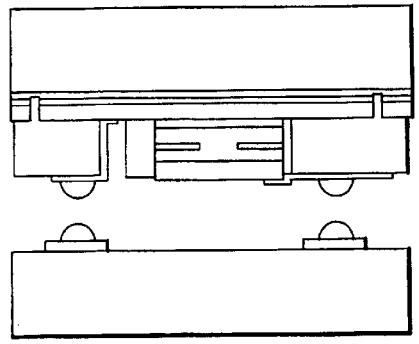
Figure 12C:
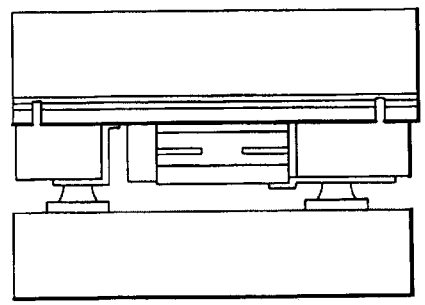
Figure 12D:
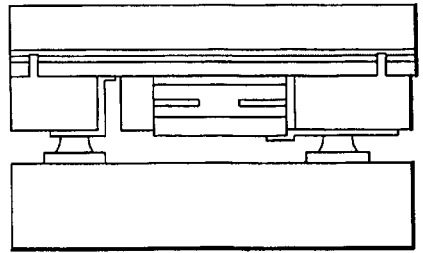
Figure 12E:
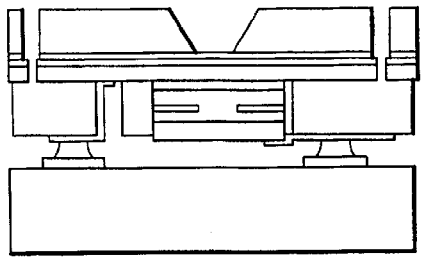
Figure 12F:
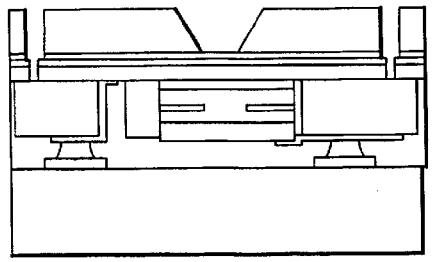

FIG. 10f shows the device of FIG. 10e after an optional thermally conductive material 1040 has been applied to the device such as, for example, a low viscosity (so it flows well for good coverage) thermal epoxy having good thermal conductivity when cured.

Although the above was illustrated with reference to a laser device, the process would be that same for a detector type device, except that the detector device may also be AR coated.

FIGS. 11a–11f show another opto-electronic device being created in a manner similar to the one shown in FIGS. 10a–10f except that this laser device uses the semiconductor material of the device as the stands 1102, 1104.

Figure 13:
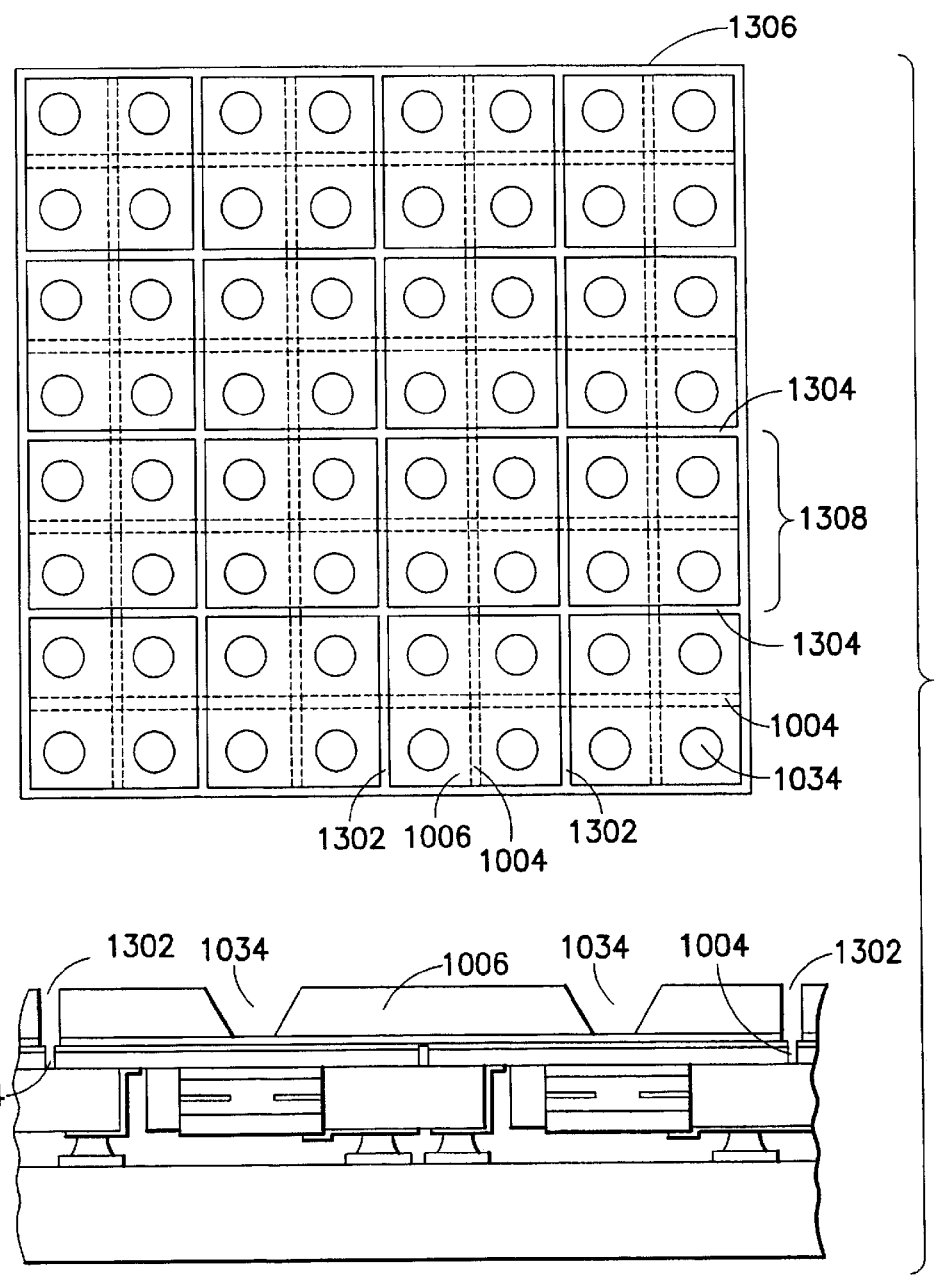
FIG. 13 illustrates one example process for creating an electro-optical chip variant according to the techniques described.
Figure 14A:
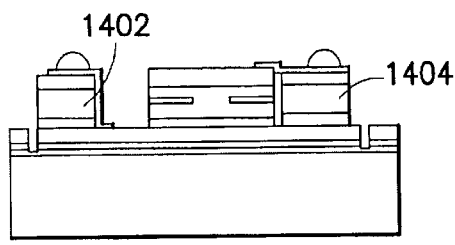
FIG. 14 illustrates another opto-electronic device being created in a manner similar to the devices of FIGS. 10–12.
Figure 14B:
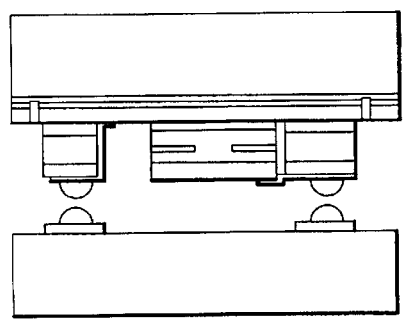
Figure 14C:
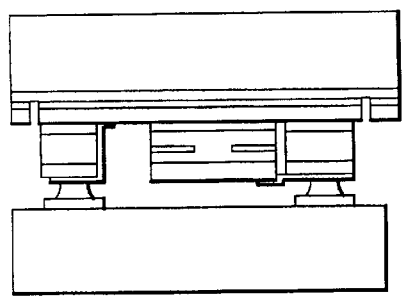
Figure 14D:
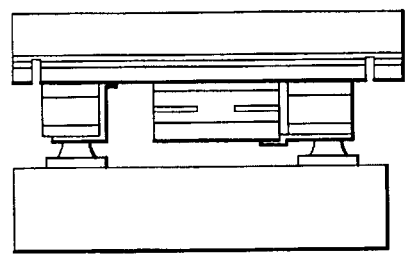
Figure 14E:
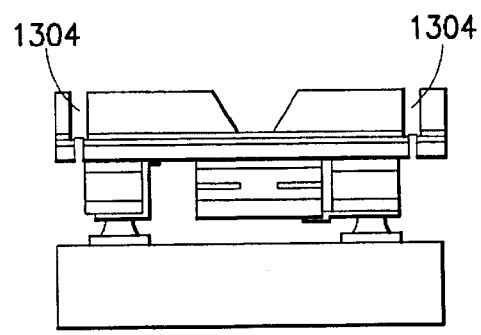
Figure 14F:
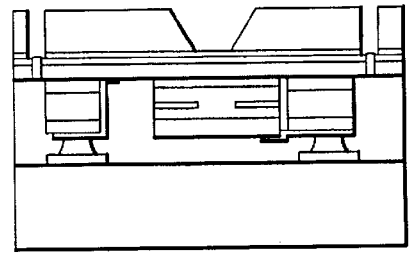

FIGS. 12a–12f show another opto-electronic device being created in a manner similar to the preceding devices. As shown, this device is of the type where the device semiconductor material is not used for the stands. Additionally, the lasers of this opto-electronic device are grouped so that they can be used in a redundant fashion. As noted above, the creation of an array having redundant lasers is described in the incorporated by reference patent application entitled Redundant Optical Device Array. Specifically, FIG. 13, shows two adjacent lasers in the array where, in addition to creating an access way 1034, grouping trenches 1302, 1304 are etched in the remaining substrate 1006 using known etching techniques, to a depth that connects the grouping trenches 1302, 1304 with some of the isolating trenches 1004. In this manner, two or more lasers can be arranged to share a common fiber with one or more serving as a back-up laser, such as described in commonly assigned application entitled Redundant Optical Device Array which is incorporated herein by reference.

One advantage arising from grouping the lasers in this manner is that yield for a single wafer is increased because, for example, with a pair of grouped lasers, if one laser is damaged, the other can be used in its place. Another potential advantage to doing so can be an increased lifetime for the opto-electronic device. For example, when one laser of the pair finally dies, if the lasers are externally, independently selectable, the second laser can be selected and brought on line in place of the bad one.

Yet another achievable advantage is reduced cost to achieve one or both of the immediately preceding two advantages. Since the incremental cost of increasing the number of lasers on a wafer is negligible, the improved yield and/or reliability/extended life is virtually free.

FIG. 13 also shows a functional representation of an example array 1306 produced using the technique of FIGS. 12a–12f. The array 1306 is illustrated from the top of the device so that the access way 1034 and remaining substrate 1006 over each laser is clearly visible. As shown in FIG. 13, the lasers are grouped in fours, a group 1308 being defined by the grouping trenches 1302, 1304 which ensure that there is no current path between adjacent lasers in the group 1308 via the substrate 1006 which is electrically conducting. For purposes of illustration, some of the isolating trenches 1004 are shown although none would actually be visible from this vantage point.

FIGS. 14a–14f, show another opto-electronic device being created in a manner similar to the devices of FIGS. 10 through 12. As shown, this device is of the type where the device semiconductor material is used for the stands 1402, 1404. Additionally, the lasers of this opto-electronic device are also grouped in the manner of FIGS. 12 and 13 except in pairs (one of which is not shown), as is evident from the grouping trenches.

As noted above, a manufacturer of opto-electronic devices of the type described above has two avenues for obtaining the optical devices—they can manufacture them themselves, or they can obtain them from a third party. By manufacturing the optical devices (referred to hereafter for simplicity as an "optical chip") and the electronic wafer (referred to hereafter for simplicity as an "electronic chip"), the manufacturer can take measures to ensure that the pads on each are properly placed so as to align with each other when the optical chip is positioned over the electronic chip. However, typically electrical and optical chips are not designed concurrently, even if they are designed and fabricated within the same organization. Thus, even with a single manufacturer, unless there is close coordination within the organization with regard to both the optical and electronic chip design, a lack of correspondence between contact pads on each can easily occur—particularly where one or both are also designed with sales to third parties or integration with devices from other sources is contemplated. Moreover, subsequent improvements or changes in the design of either may necessitate altering the location of the contact pads, thereby introducing a pad misalignment where none previously existed, even within the same organization.

Even worse, if the electronic chip is designed to be used with a variety of different optical chips, but the optical chips are commodity stock obtained from third parties (for example, chips containing: topside emitting cavity lasers, bottom emitting cavity lasers, DFB or DBR lasers, topside receiving detectors or bottom receiving detectors) that are mass manufactured for distribution to multiple unrelated users, it is unlikely that the pads on the optical devices will all be located in the same place, if they are otherwise compatible with the electronic chip.

For example, as shown above in connection with FIG. 3, a single optical device has contact pads placed in the position specified by its manufacturer and an electronic wafer also has contact pads, onto which an optical device can be connected, placed in the position specified by its manufacturer. When the optical device is flipped over, for flip-chip type bonding with the electronic wafer, the contact pads of each will not be aligned. Nevertheless, by altering the technique described above, the invention can be employed with lasers other than the bottom emitting lasers referred to in the examples up until now, as well as with bottom emitting lasers having different contact pad alignments, top or bottom receiving detectors.

Advantageously, this allows for the selection and use of the "best-of-breed" chips having the best individual performance for the application and avoids eliminating such vendors merely because they can not, or will not, meet an electrical contact placement requirement or standard.

In general, two different processes are used, depending upon whether the optical devices are bottom emitting/receiving or topside emitting/receiving.

For ease of explanation, the term "bottom active" will be used to refer to both bottom emitting devices (lasers) and bottom receiving devices (detectors). Similarly, "top active" or "topside active" will refer to both top emitting lasers and top receiving detectors.

Bottom Active Device Process

Figure 15:
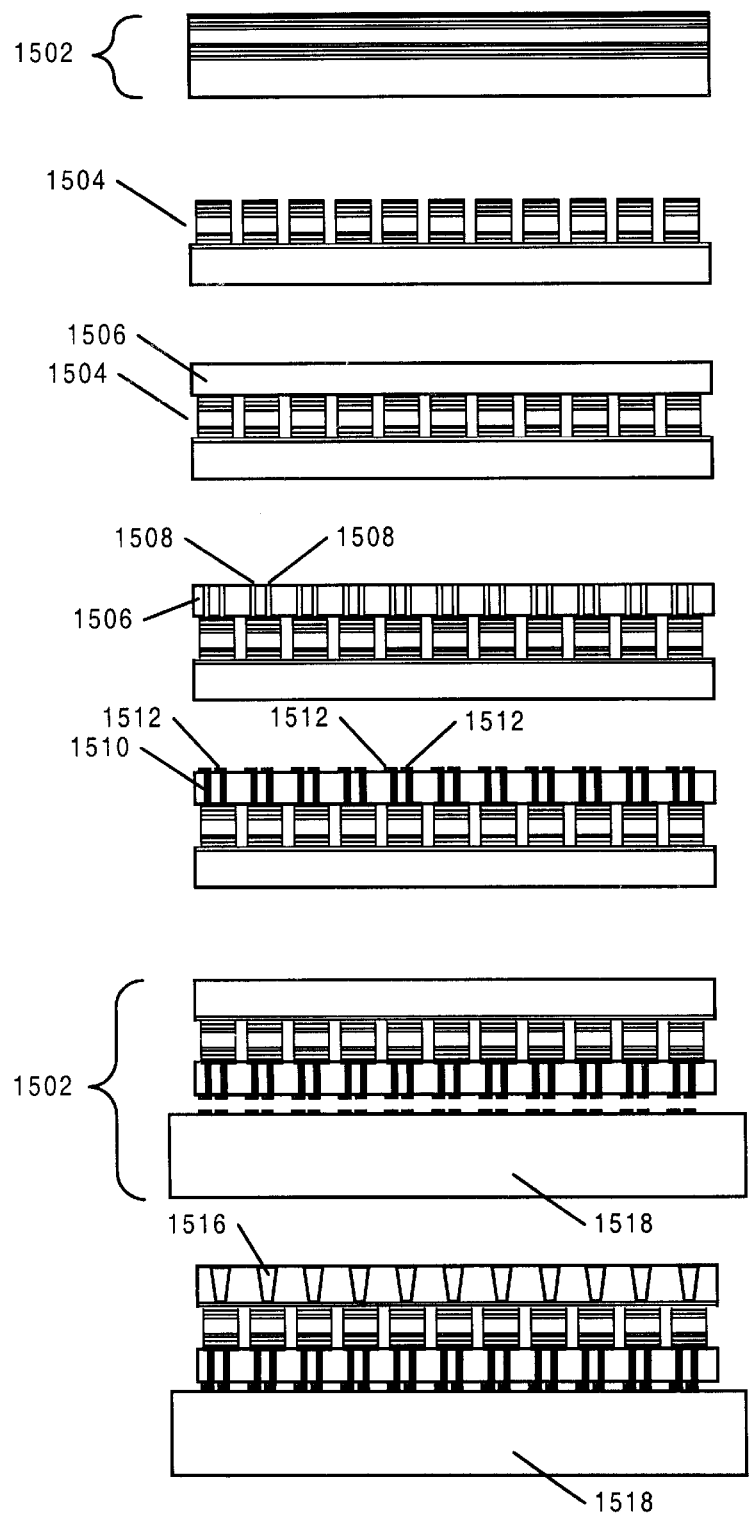
FIG. 15 illustrates a process usable for bottom active devices.

The process as usable for bottom emitting/receiving devices (i.e. bottom active devices) will now be explained, with reference to FIG. 15. To facilitate explanation, it should be presumed that the optical wafer 1502 was processed into an optical chip 1504 as discussed above. Alternatively, the optical chip 1504, can have been obtained from some third party.

First, an insulating layer 1506 is added to the surface of the optical chip 1504 using known techniques.

Then openings or vias 1508 are created in the insulating layer 1506 to allow access to the contact pads of the optical chip. This is again done by laser drilling or etching, for example in the manner used for creating through holes in wafers described in commonly assigned applications entitled Multi-Piece Fiber Optic Component And Manufacturing Technique filed concurrently herewith and incorporated herein by reference.

Alternatively, the openings or vias 1508 can be preformed in the insulating layer prior to attachment, for example, if the contact pad locations are known in advance.

Then, the openings or vias 1508 are made electrically conductive by applying an electrically conductive material 1510 to the sidewalls of the openings or vias (which may optionally have been previously coated with an insulator) or filling the openings or vias with the material 1510.

Advantageously, if the openings or vias are not fully filled, they can be used to aid alignment. This can be done if the openings or vias are wide enough to allow the solder bumps on the other chip to "slot" into the holes, thereby providing an initial alignment between the two. Moreover, in some cases, capillary action will cause the solder to be partly drawn into the openings or vias as it melts causing a better connection and further aiding in alignment.

Optionally, and alternatively, if the openings or vias were pre-formed prior to attachment, the coating or filling of the openings or vias (as desired) can also be performed prior to attaching the insulating layer to the optical chip.

Next, electrical traces 1512 are patterned on the exposed side of the insulator to create a conductive path from the (now coated or filled) opening or via to the location(s) on the insulator surface that will align with the placement of the contact pads on the electrical wafer. Optionally, if several different alignments are possible, depending upon the particular electronic chip the optical chip will be mated with, a single trace can create two or more alternative connection points or create a connection region if the contacts to be mated with are offset from each other slightly, but within a manageable defined area.

In a variant of the above, if the chip to which the optical chip will be joined is an electronic chip (as opposed to another optical chip, such as a modulator, or another laser to which the optical chip is optically transparent) the electrical traces could be patterned on the electronic chip since, in general, most electronic chips already come with an insulating layer that can be used for contact rerouting.

Once this is accomplished, the process proceeds as described above, with the joining of the two chips 1514 (in this example, using flip-chip techniques) followed by, in the particular case, thinning of the substrate, removal of the substrate entirely, or leaving of the substrate at the thickness it is. Thereafter, creation of access ways 1516, patterning of the chip substrate, flowing of a thermal conductor, or application of AR coating can be accomplished as desired or needed.

Topside Active Device Process

The process as usable for topside emitting/receiving devices (i.e. topside active devices) will now be explained, with reference to FIG. 16. To facilitate explanation, it should be presumed that the optical chip was obtained from some third party, the process of creating the optical chip itself being independent of the invention.

In addition, either or both of two optional steps can be performed prior to starting the process. The first, attaches a carrier by the top-side surface of the optical chip. This carrier can be made of any material and is merely used for rigidity and holding the optical chip during the rest of the processing. The second, involves thinning the optical chip substrate. This reduces the amount of material that must be etched or drilled through to access the contacts present on the front of the optical chip.

At this point, the process proceeds in an analogous manner to the process of FIG. 15 as follows.

Holes or vias are either etched or drilled through the optical chip substrate to the contacts on the front of the optical chip.

The holes or vias are then coated or filled with, an electrically conductive material (which may be under layered by an insulator coating) to bring the contacts out to the back of the optical chip.

Alternatively, for example, if the contacts are located such that access directly from the back of the chip through the substrate would damage the chip or present some other problem, the holes or vias are etched or drilled in a suitable location and an electrical conductor can be added to the front side to connect the contact pad with the conductor coating or filling the vias or holes.

Advantageously, if the openings or vias are not fully filled, they can be used to aid alignment. This can be done if the openings or vias are wide enough to allow the solder bumps on the other chip to "slot" into the holes (FIG. 16B), thereby providing an initial alignment between the two. Moreover, in some cases, capillary action will cause the solder to be partly drawn into the openings or vias as it melts causing a better connection and further aiding in alignment. Or, if the vias or holes can be located so as to coincide with the proper location for aligned mating with the electronic chip, that can also be done, and the vias or holes can be connected to the contact pads on the front side using conventional techniques.

Figure 16A:
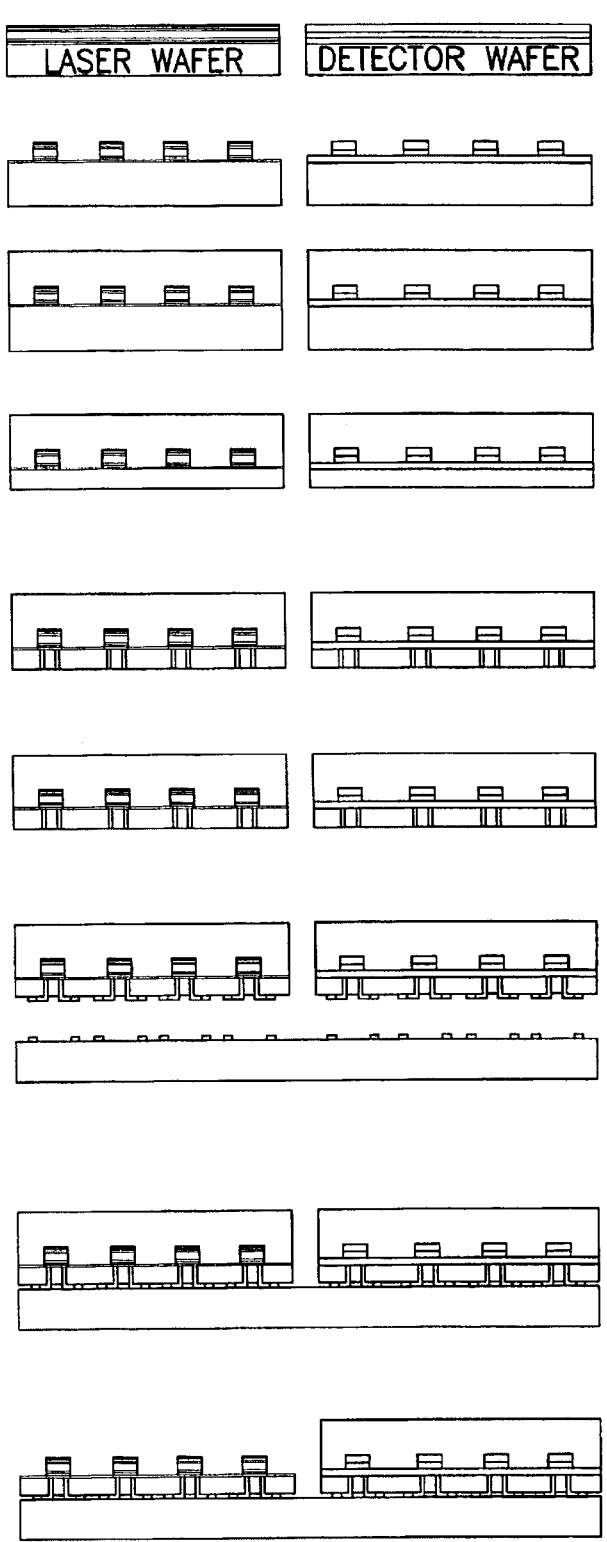
FIG. 16A illustrates a process usable for topside active devices.
Figure 16B:
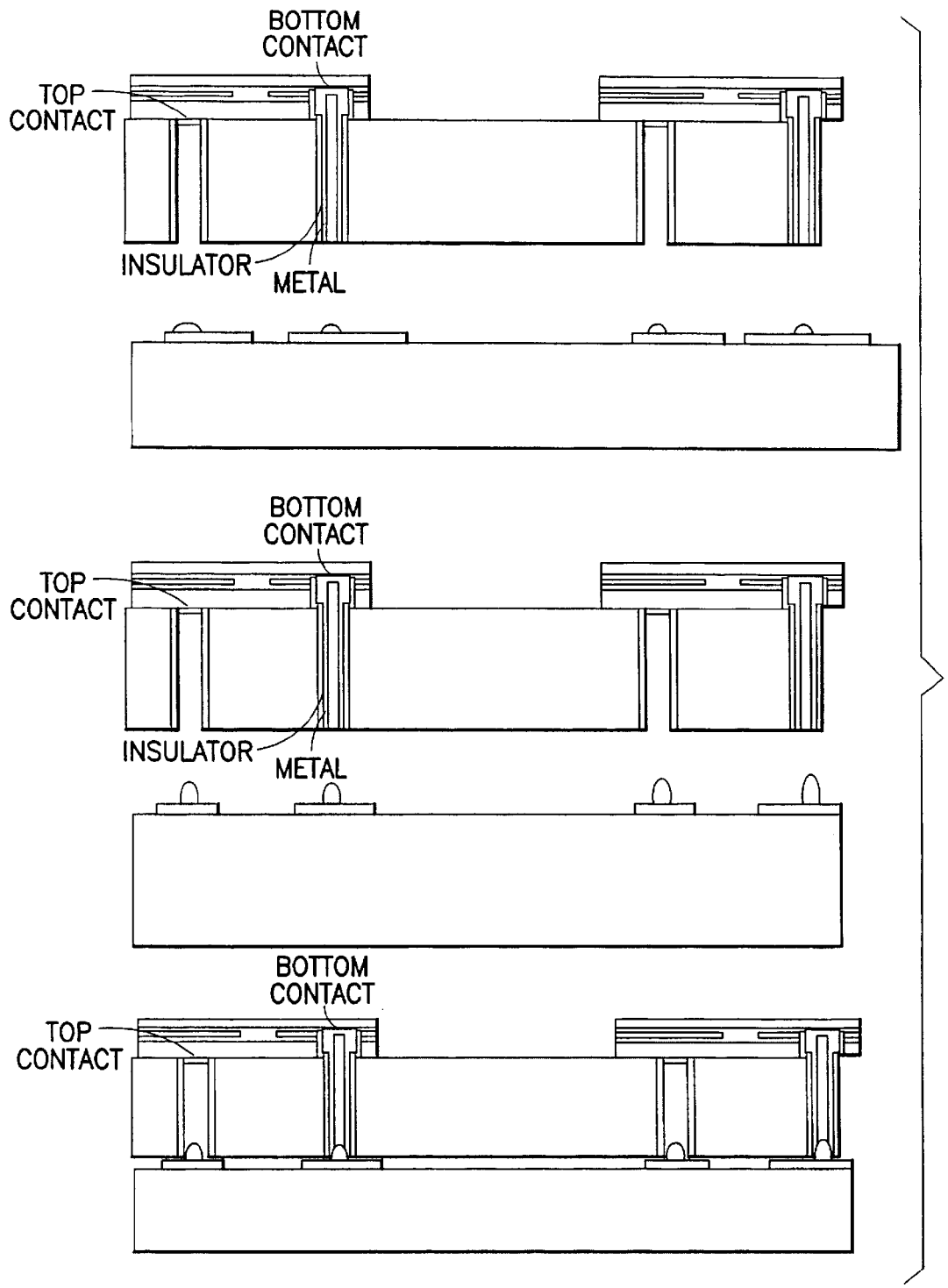
FIG. 16B illustrates the process where the contact holes are coated, but not filled, and can assist in alignment.
Figure 16C:
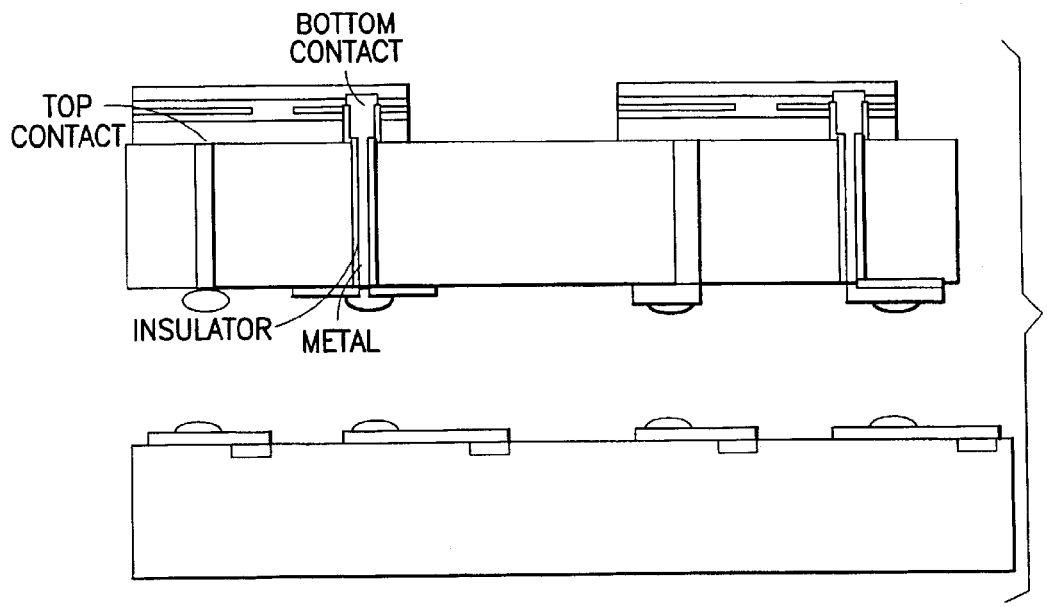
FIG. 16C shows an optical chip with its contacts rerouted by patterning traces on the substrate to match the contacts on another chip.
Figure 16D:
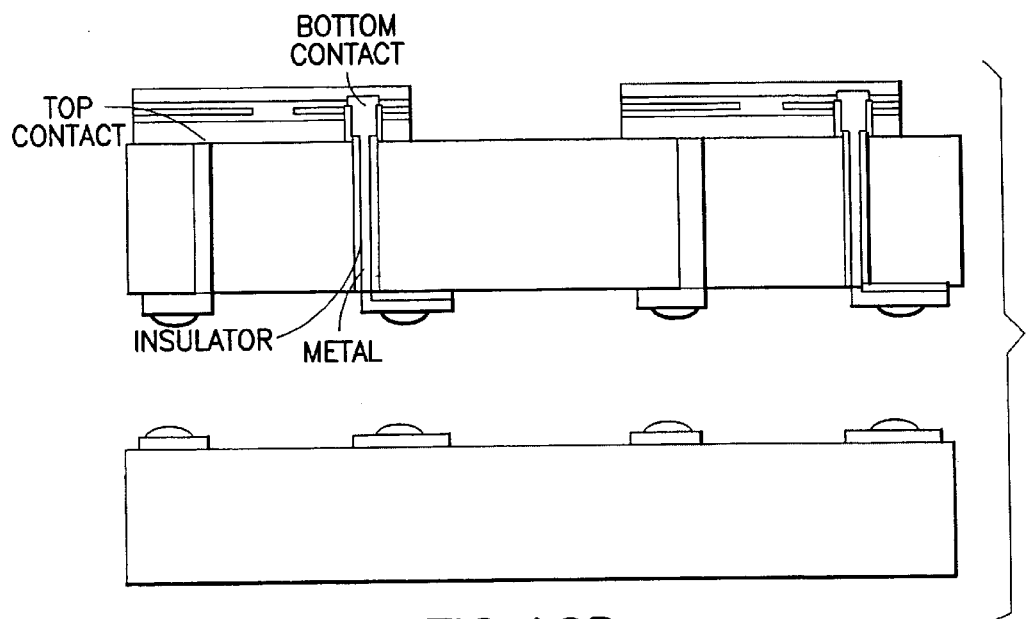
FIG. 16D shows the contacts on an electronic chip rerouted by patterning traces on the substrate to match the contacts on an optical chip.

As with the backside emitting/receiving device integration process, if the vias or holes do not coincide with the contact pads of the electronic chip, electrical traces are patterned on the substrate of the optical wafer FIG. 16C or the other chip FIG. 16D, in this case the electronic chip, to provide a connection between the vias or holes and the contact locations on the other chip.

At this point, the chips can be brought together and connected as described above.

If the optional step of adding the carrier was performed, the carrier can now be removed. If the carrier is so thick as to cause optical access problems or has an incompatible complex refractive index which would adversely affect transmission of laser light through the carrier, it should be removed. In alternative variants, the carrier can be left on, even if it would cause optical access problems or has an incompatible complex refractive index, by patterning access ways or through holes in the carrier, preferably prior to attachment to the optical chip.

In addition, if desired, one or more additional optical elements, such as microlenses or waveguides, can be put on top of the carrier.

Figure 17:
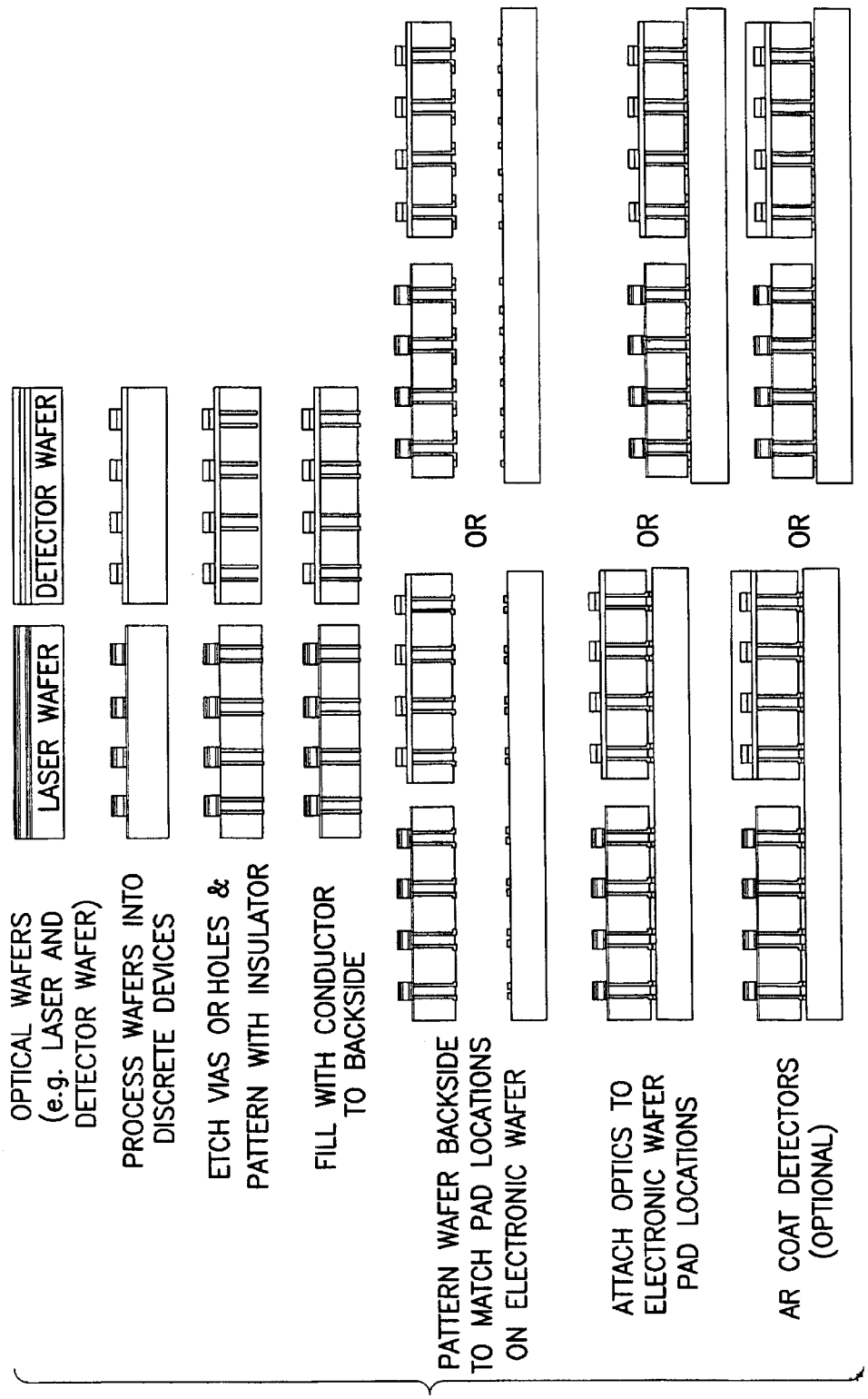
FIG. 17 illustrates a process similar to that shown in FIG. 16A except that a carrier is not used.

FIG. 17 shows a process similar to that shown in FIG. 16 except a carrier is not used.

Connection or Adapter Chip Alternative

In an alternative variant usable, for example, when both the optical chip and the other chip are purchased from different parties or two or more different chips are under consideration and they have different contact pad placements, but the contact pad placement on each is known, an "adapter" or connection chip can be readily fabricated by employing the teachings herein in a straightforward manner, thus allowing design and/or manufacture to proceed nevertheless.

Figure 18:
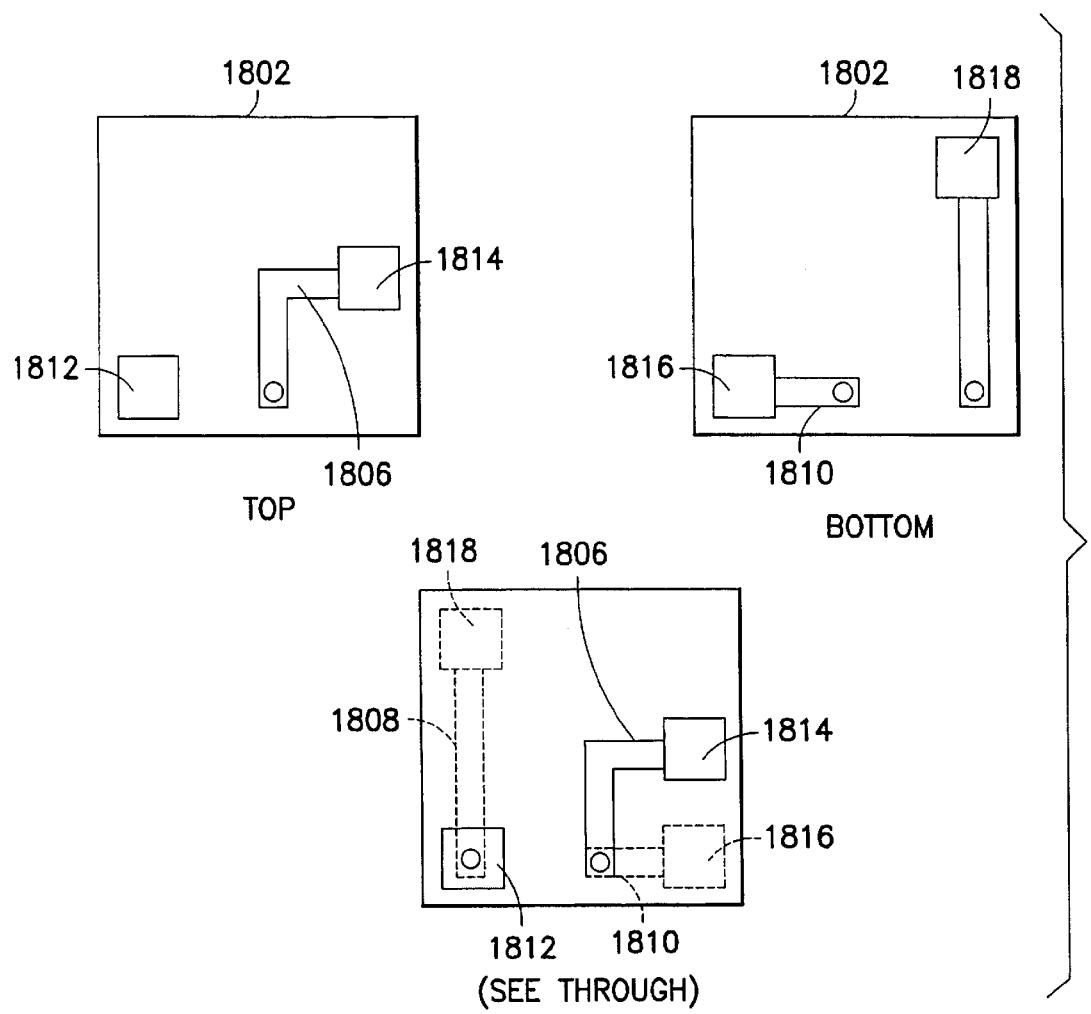
FIG. 18 illustrates a connection chip or adapter chip used to connect different devices.

Referring now to FIG. 18 which shows a connection chip or adapter chip used to connect different devices, the top side 1802 and bottom side 1804 of a common wafer 1800 is patterned so as to create traces 1806, 1808, 1810 on each side from the specified contact pad locations 1812, 1814, 1816, 1818 for each chip to some common point for each.

Through holes are then created and crated or filled with a conductive material so as to join corresponding pairs, e.g., one contact on the top with its appropriate contact on the bottom when the two are brought together.

Figure 19:
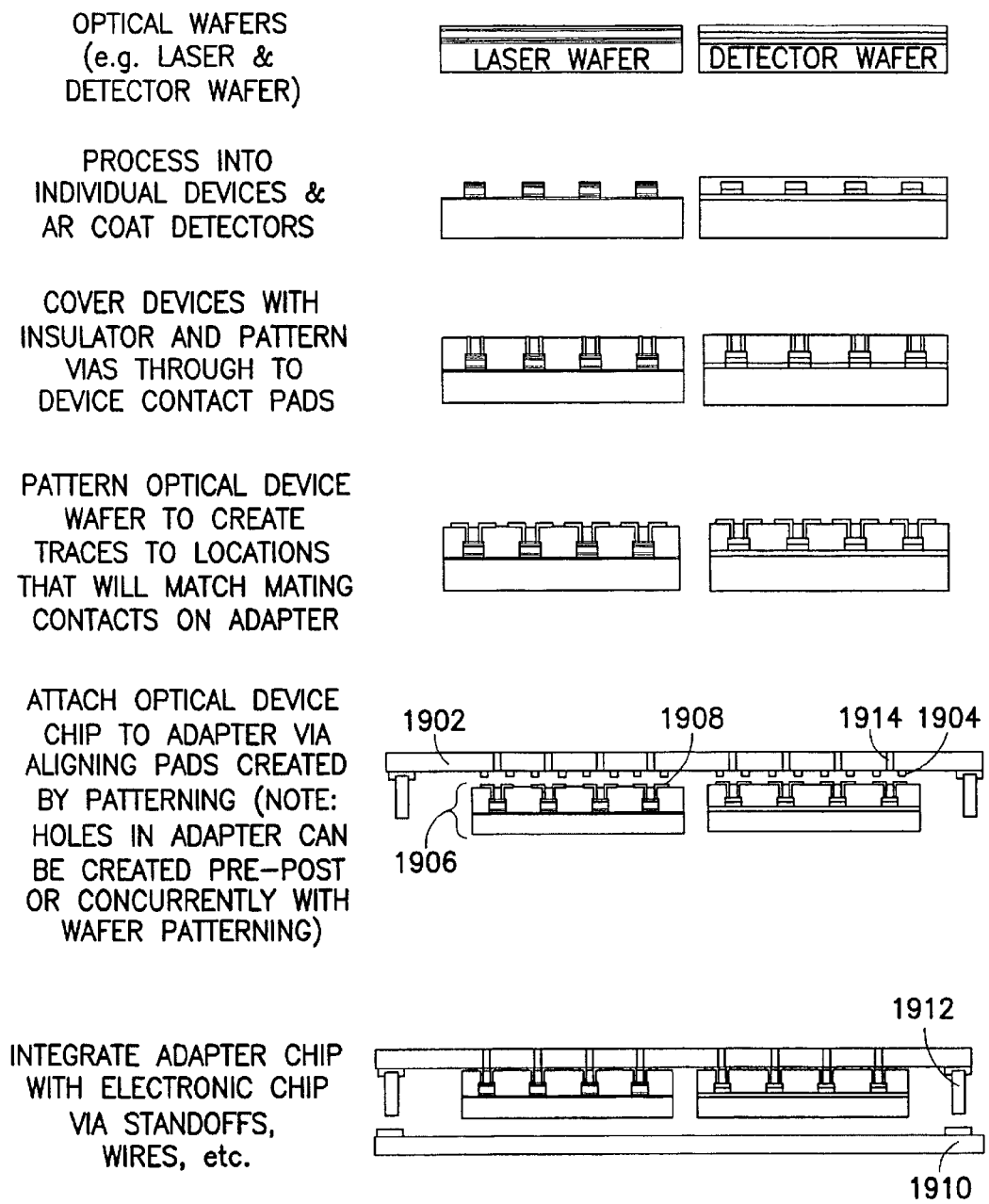
FIG. 19 illustrates another alternative implementation, which is a further variant of the adapter or connection chip variant, usable for topside active devices.

FIG. 19 shows another alternative implementation, which is a further variant of the adapter or connection chip variant, usable for topside active devices. As shown, the adapter or connection chip 1902 has electrical contacts 1904 on only one side for direct connection to the optical chip 1906 via connection pads 1908 and connection to the electronic chip 1910 via, for example, standoffs 1912, jumpers, wires, ribbons or other known attachment devices. In this arrangement, because the devices are top emitting/receiving and the adapter is located on the top side and, "optical vias" 1914 are also provided in the adapter to allow access to the optical light.

Then the optical chip can be placed on top of the electronic chip and the connection chip can be placed on top of both chips to provide connectivity between the optical and electronic chips.

As a side note, although described in connection with mating optical chips with electronic chips, the same basic process (i.e. use of a connection chip or appropriately patterned insulating layer or substrate to account for pad mismatch) can be adapted in a straightforward manner to account for a pad misalignment between any combination of optical, electrical, electronic, or electromechanical wafers.

Further Variants

As also noted above, in some cases it is sometimes desirable to coat some of the devices, specifically the detectors, with an AR coating. However, the opto-electronic chips described above are made up of two (or potentially more) dissimilar types of optical devices. And it is undesirable to have the AR coating detrimentally affect the lasers.

Advantageously, in a further optional variant of the above processes, the devices that need to be AR coated do not have to be distinguished from those that ordinarily would not be AR coated.

The process largely follows the process flows described above in connection with FIG. 5 where the laser wafers and detector wafers are created, flipped over and attached to the electronic chip via flip-chip bonding techniques.

The substrates are thinned, but as to the laser substrate, only to the point where the substrate could still by considered thick relative to the thickness of the laser cavity. Although different types of laser devices will require a different specific thickness, the thickness of the substrate should be at least several times as large as the thickness of the laser cavity, in the case of DFBs and DBRs and the distance between the mirrors, in the case of VCSELs (shown by way of example as $\Delta L$. in FIG. 5). Since the precise distance will vary from device to device, a good rule of thumb is to use a factor of 10× the thickness of the laser cavity. However, if the thickness can be controlled precisely, it can be less than the 10×factor, the particular minimum thickness (shown by way of example as "t" in FIG. 5) being empirically ascertainable as the minimum thickness where the AR coating does not affect the laser's ability to lase (i.e. the minimum lasing thickness).

An analogous approach can be used for topside active lasers. In the case of topside active lasers, a substrate (which can be the carrier noted above, a separate substrate applied after carrier removal, or, if contact rerouting is not necessary or performed on the other chip, instead of a carrier) is attached to the topside of the lasers. The substrate is either thinned, after application, to a thickness as noted above, thinned to such thickness prior to application.

Once this is achieved, the lasers and detectors can be anti-reflection coated at the same time. Thus, there is no need for special patterning or otherwise distinguishing between the lasers and detectors during the AR coating process.

Figure 20A:
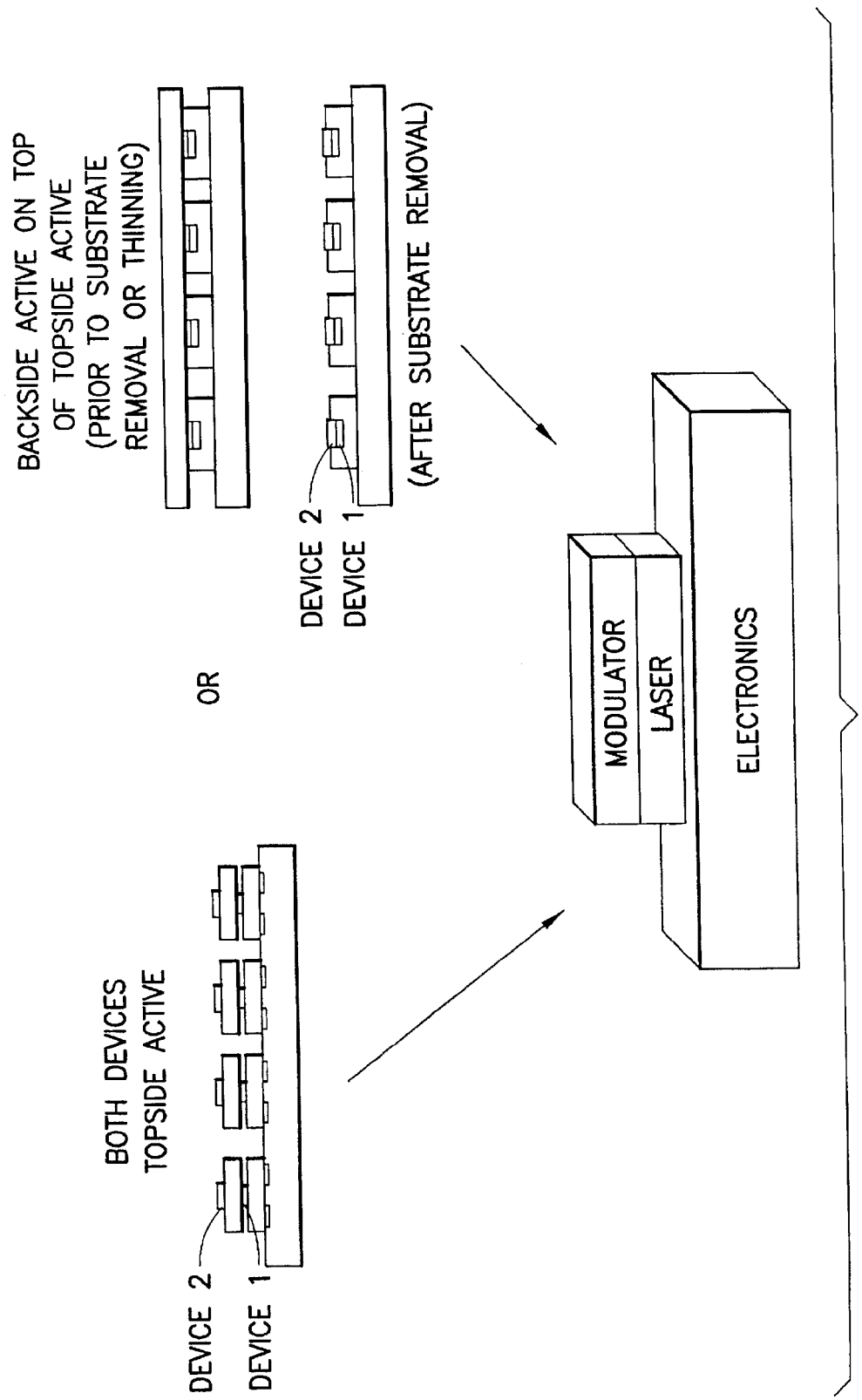
FIG. 20A illustrates the stacking of two or more devices using one of the techniques according to the invention.
Figure 20B:
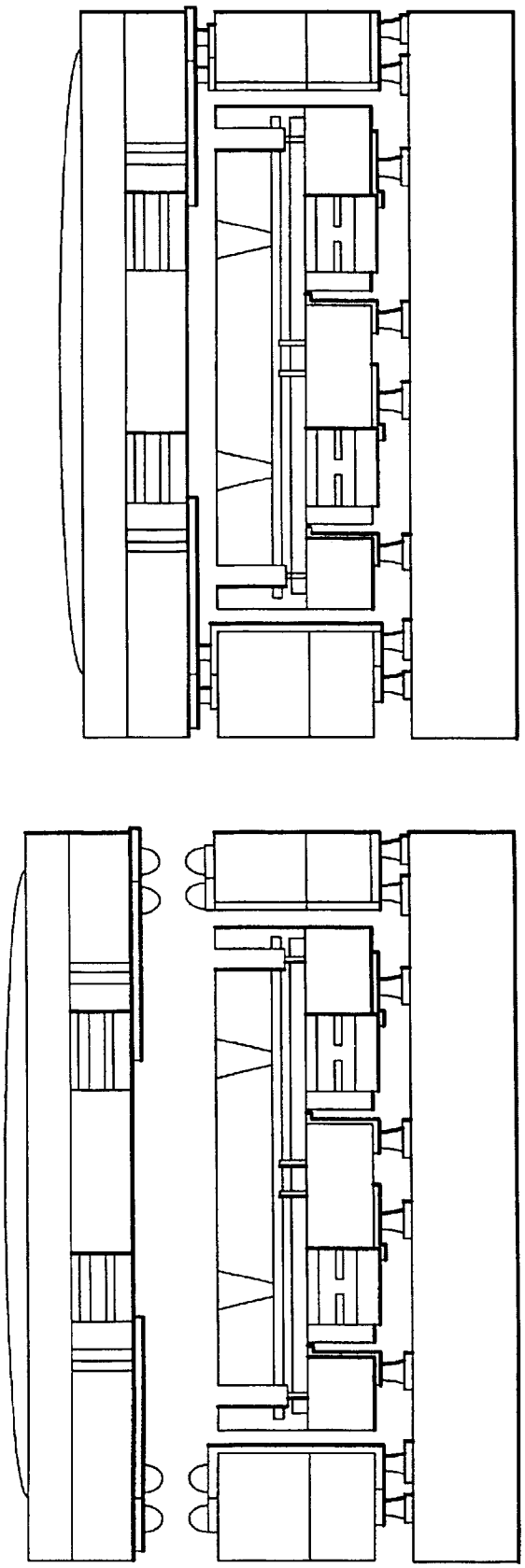
FIG. 20B illustrates a modulator stacked on top of a laser using one of the techniques according to the invention.

Thus, it should be understood that the above processes can be applied to various different devices. For example, using the teachings of the invention, stacking of modulators on top of lasers in an array compatible format can be done. In fact, it can be done when the modulators are on top of or below the laser. Moreover, it can be done whether or not the two (or more) devices are created in a single epitaxial step. Similarly, stacking of topside active devices on top of either topside or backside active devices can be performed as can stacking of backside active devices on top of either topside or backside active devices such as shown in FIG. 20A and in greater detail in for modulator mounted on a backside emitting laser 20B.

Devices that have a lattice mismatch can similarly be stacked regardless of the functions the individual devices perform.

In a further application, devices from different epitaxial wafers can be integrated together on a common chip on a wafer scale level. Thus, lasers of different wavelengths can be intermixed for dual wavelength division multiplexing (DWDM) or multiple wavelength division multiplexing (MWDM) applications, such as shown in FIG. 21.

Figure 21:
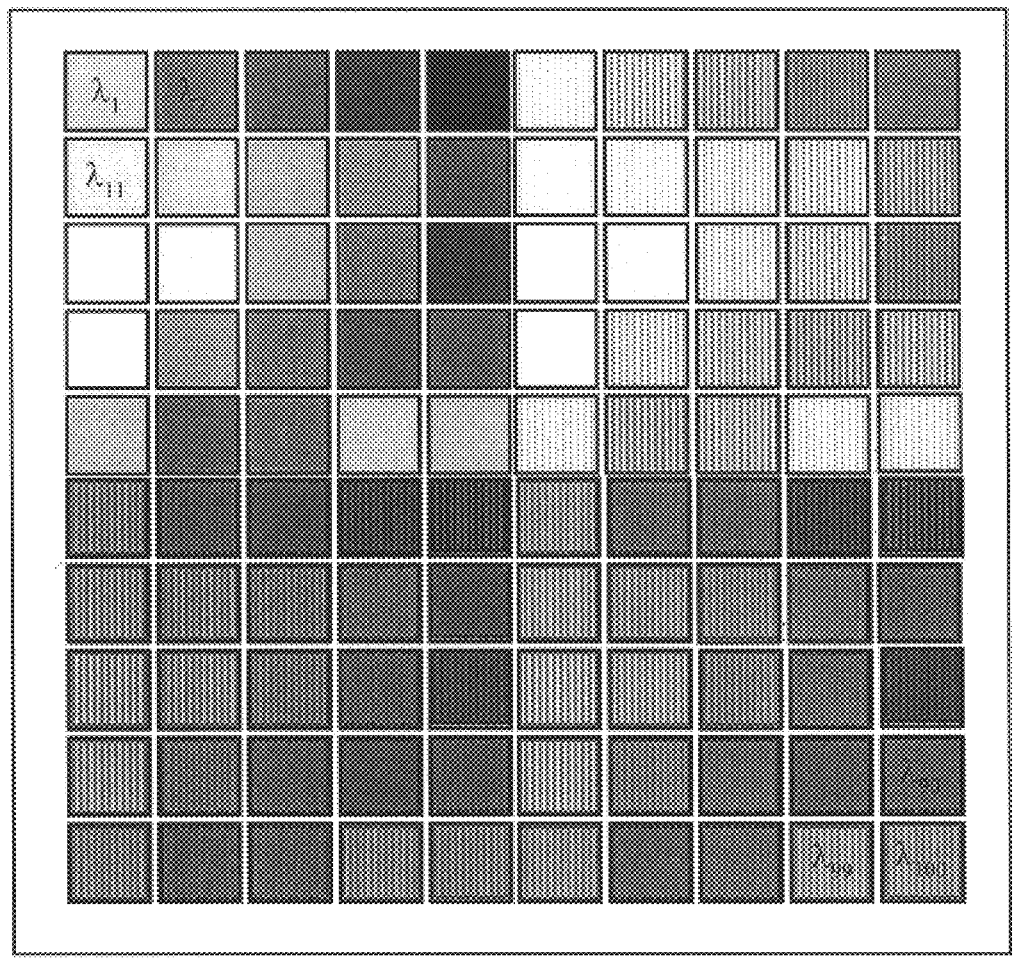
FIG. 21 illustrates an array of, for example, one hundred lasers created using one of the techniques according to the invention.

FIG. 21 shows an array of one hundred different wavelength lasers all integrated on a common chip on a wafer scale. By doing so, and making each laser selectable, a specific wavelength (or combination of wavelengths can be selected. Thereby eliminating the need for tunable lasers which rely on analog movements of physical pieces or show thermal changes or effects and where speed is limited to microseconds and accuracy is limited.

In addition, wavelengths can be switched at the same rate that data is sent, thereby making construction of a system that multiplexes various data streams at different wavelengths at the bit rate. Thus, switching can be achieved in about 100 picoseconds (10 s of gigabits/sec).

Figure 22:
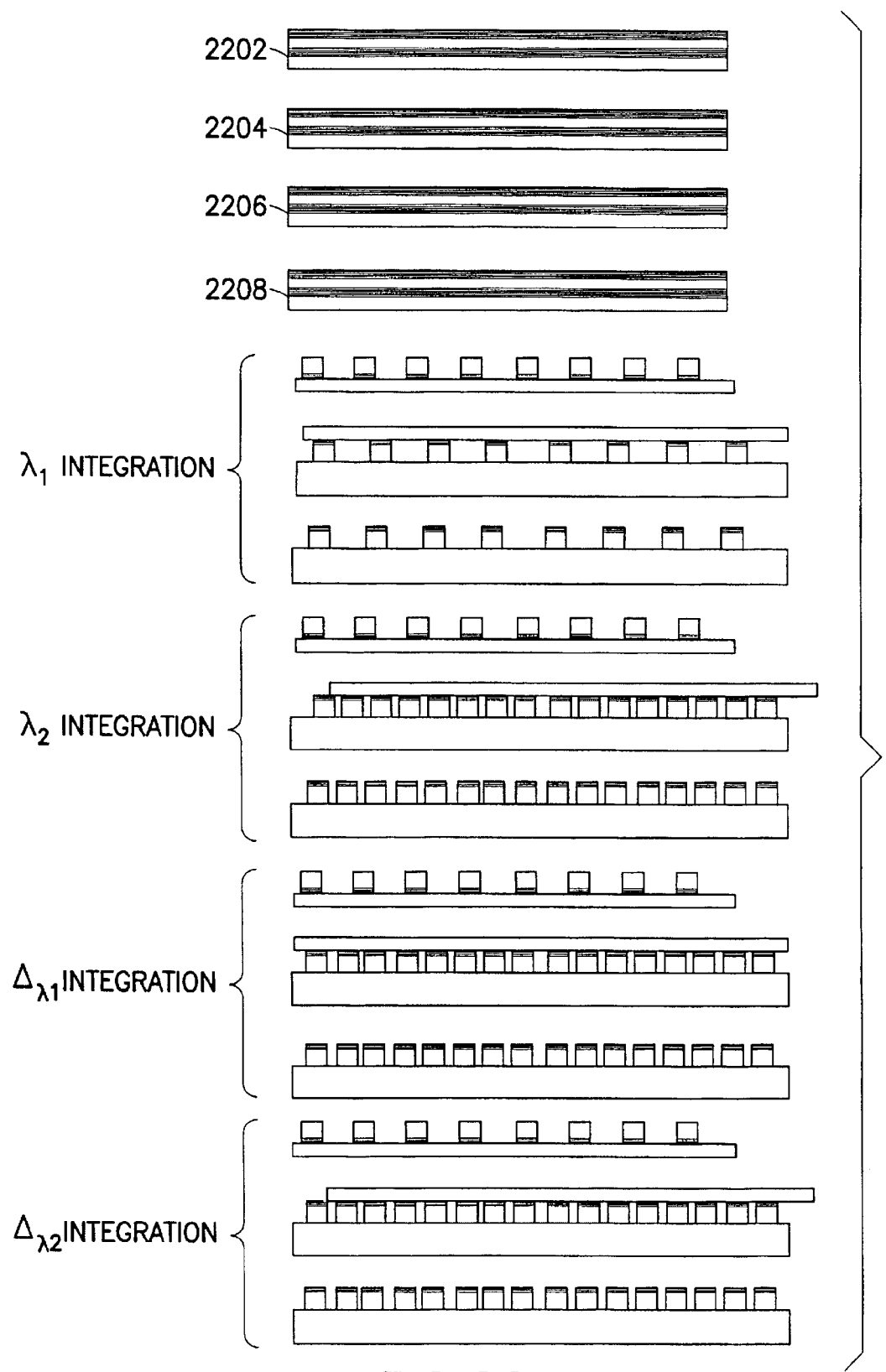
FIG. 22 illustrates the steps in creating an array for a DWDM application using one of the techniques according to the invention.

Moreover, different devices, of different types (i.e. different types of lasers, lasers and detectors, etc.) can be intermixed such as shown in FIG. 22 from a cutaway side view.

As shown in FIG. 22, strips of two different wavelength lasers 2202, 2206 are created, as are two different strips of complementary wavelength photodetectors 2204, 2208. The strips of the first devices (illustratively lasers 2202 ($\lambda_1$)) are attached using the processes described herein. The strips of the next devices (illustratively detectors 2204 ($\Delta_{\lambda 1}$)) are attached in similar fashion. Next the strips of the third devices (illustratively lasers 2206 ($\Delta_2$)) are attached in similar fashion. Finally, the strips of the lastt devices (illustratively detectors 2208 ($\Delta_{\lambda 2}$)) are attached in similar fashion.

Depending upon the particular case, the substrate or carrier can be removed or thinned from all the devices at once, for example if they did not interfere with the integration of the next devices, or they can be removed or thinned after each set of devices is attached.

Figure 23:
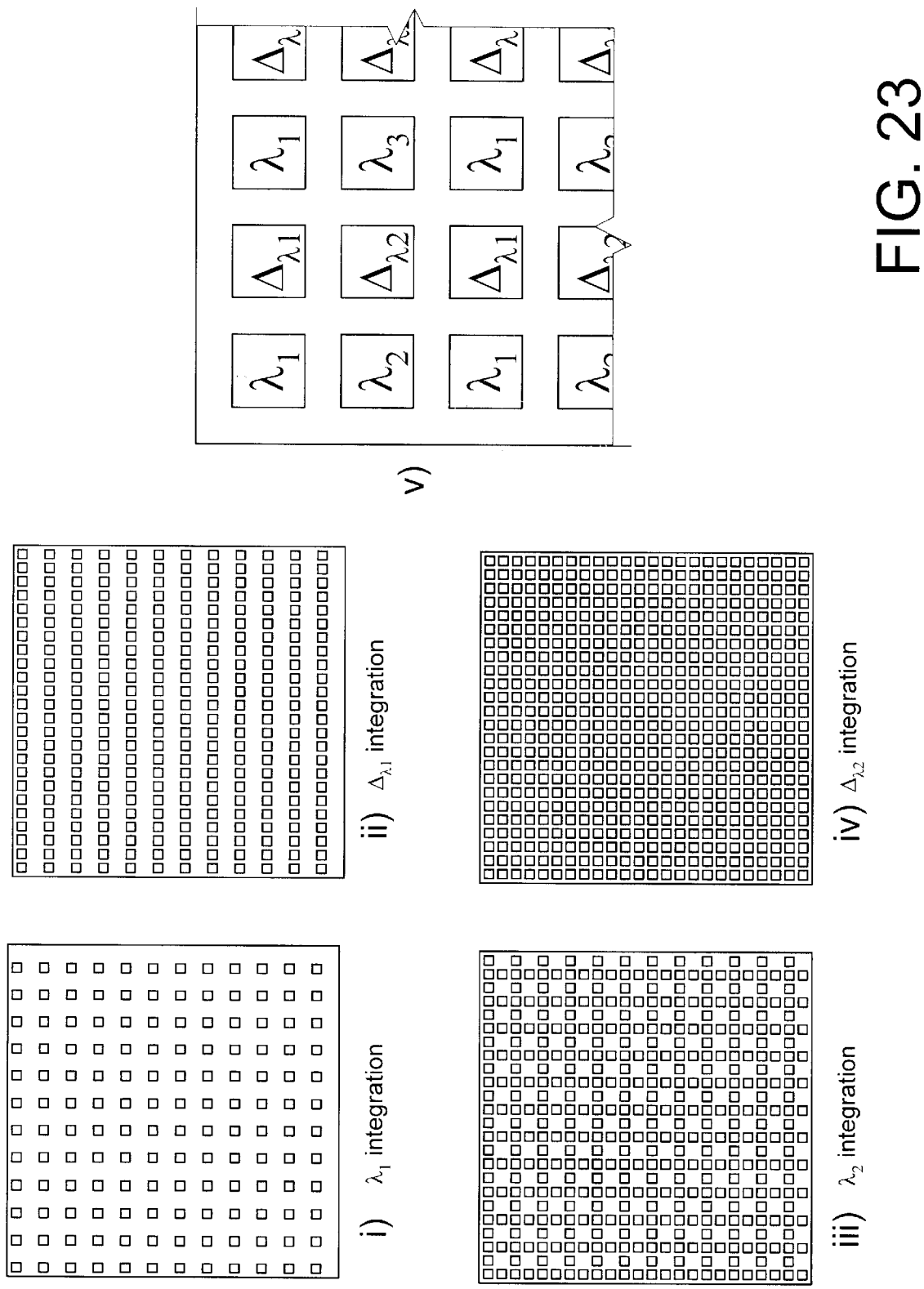
FIG. 23 illustrates the process of FIG. 22 from a top view.

FIG. 23 shows the integration of the devices of FIG. 22 from a top view. As shown, all the first wavelength lasers are attached. Then, all the first wavelength photodetectors are attached. Then all the second wavelength lasers are attached, followed by all the second wavelength photodetectors so that the end result is a fully integrated dual wavelength transceiver chip, a portion of which is shown in enlarged form on the right side of FIG. 23.

Of course, while the immediately preceding example used two lasers and two detectors, the process would be essentially the same irrespective of the number of different devices, whether they are top or bottom active, grouped, all lasers, all detectors, etc., since an advantage of the process is the ability to mix and match—particularly on a wafer scale.

In these cases, the integration can readily be performed on an individual device (or device type) basis or can be done, for example, in strips (as shown) or by groups, with the substrate left on defining the strip 2202, 2204, 2206, 2208 or group.

Still further, by integrating groups of redundant lasers of one wavelength with those of other wavelengths, an extremely reliable DWDM or MWDM module can be produced at low cost.

Thus, since single device, integrated transmitter arrays for DWDM systems are not available in the prior art, by integrating large numbers of lasers on a single chip, packaging size can be reduced. By integrating arrays of ten or more lasers, of two or more different wavelengths, onto a single chip and coupling a set of them into a single fiber, for example, using a fiber based combiner/inverse splitter, a holographic lense array, or the techniques of the incorporated by reference applications entitled Multi-Piece Fiber Optic Component And Manufacturing Technique, the multiplexing of multiple wavelengths can be achieved in the output fiber, in some cases without the need for an opto-mechanical or electro-optical element to do the switching (optical crossconnect).

In a further application of the techniques, a large array can be constructed that can serve as both a pumping laser and a communications laser, either at different times or concurrently.

It should be understood that the above description is only representative of illustrative embodiments. For the convenience of the reader, the above description has focused on a representative sample of all possible embodiments, a sample that teaches the principles of the invention. The description has not attempted to exhaustively enumerate all possible variations. The alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A method of integrating a chip with a backside active optical chip, the backside active optical chip comprising at least one optical device, having an active side, including an optically active region and an optically inactive region each abutting a substrate, a bonding side opposite the active side, and a device thickness, the method comprising:

etching grouping trenches on a portion of the backside active optical chip;

and if the substrate has a substrate thickness in excess of 100 microns over the optically active region, thinning the substrate over the optically active region while leaving at least some substrate over the optically inactive region;

bonding the optical chip to the electronic chip using a flip chip process; and creating access ways in the substrate over optically active regions.

2. The method of claim 1 wherein the thinning comprises thinning the substrate over the optically active region to a thinned substrate thickness of about the device thickness.

3. The method of claim 1 wherein the thinning comprises thinning the substrate over the optically active region to a thinned substrate thickness in a range of about 0 microns to about 100 microns.

4. The method of claim 1 wherein the thinning comprises thinning the substrate over the optically active region to a thinned substrate thickness in a range of about 50 microns to about 100 microns.

5. The method of claim 1 wherein the thinning comprises thinning the substrate over the optically active region to a thinned substrate thickness in a range of about 20 microns to about 100 microns.

6. The method of claim 1 wherein the thinning comprises thinning the substrate over the optically active region to a thinned substrate thickness in a range of about 20 microns to about 50 microns.

7. The method of claim 1 wherein the active region has an active region height and the thinning comprises thinning the substrate over the optically active region to a thinned substrate thickness of about ten times the active region height.

8. The method of claim 1 wherein the optical device is a laser and the active region has an active region height and the thinning comprises thinning the substrate over the optically active region to a thinned substrate thickness equal to at least a minimum lasing thickness.

9. The method of claim 8 further comprising, after the thinning, applying an anti-reflection coating to the laser.

10. The method of claim 1 further wherein the creating access ways in the substrate comprises:

drilling into the substrate.

11. The method of claim 1 further wherein the creating access ways in the substrate comprises:

etching the substrate so that the substrate has a hole.

12. The method of claim 11 wherein the etching campuses:

creating a straight sidewall to define at least a portion of the hole.

13. The method of claim 11 wherein the etching comprises:

creating a sloped sidewall to define at least a portion of the hole.

14. The method of claim 11 wherein the etching comprises:

creating a straight sidewall to define a first portion of the hole; arid creating a sloped sidewalls to define a second portion of the hole.

15. The method of claim 1 wherein the at least one optical device comprises a detector, arid the method further comprises:

anti-reflection coating the detectors.

16. The method of claim 1 wherein the at least one optical device comprises a laser, and the method further comprises:

resist patterning the substrate.

17. The method of claim 1 wherein the substrate has a surface area, the method further comprising removing substrate to increase the surface area by an amount.

18. The method of claim 1 further comprising:

inserting an end of an optical fiber into the access way.

19. The method of claim 1 further comprising:

supporting an end of an optical fiber using the access way.

20. The method of claim 1 further comprising;

inserting a portion of a micro lens into the access way.

21. The method of claim 1 further comprising:

supporting at least a portion of a microlens using the access way.

* * * * *

UNITED STATES PATENT AND TRADEMARK OFFICE
CERTIFICATE OF CORRECTION

PATENT NO. : 6,620,642 B2
DATED : September 16, 2003
INVENTOR(S) : Greg Dudoff et al.

It is certified that error appears in the above-identified patent and that said Letters Patent is hereby corrected as shown below:

<u>Column 18,</u>
Lines 36 and 40, the word "arid" should be replaced with -- and --.

Signed and Sealed this

Twenty-first Day of October, 2003

JAMES E. ROGAN
*Director of the United States Patent and Trademark Office*